US007001808B2

(12) United States Patent
Tsukamoto et al.

(10) Patent No.: US 7,001,808 B2
(45) Date of Patent: Feb. 21, 2006

(54) SEMICONDUCTOR INTEGRATED CIRCUIT DEVICE HAVING A DUMMY CONDUCTIVE FILM AND METHOD OF MANUFACTURING THE SAME

(75) Inventors: Keisuke Tsukamoto, Ome (JP); Yoshihiro Ikeda, Hamura (JP); Tsutomu Okazaki, Ome (JP); Daisuke Okada, Kunitachi (JP); Hiroshi Yanagita, Hamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/786,334

(22) Filed: Feb. 26, 2004

(65) Prior Publication Data

US 2004/0164375 A1  Aug. 26, 2004

Related U.S. Application Data

(63) Continuation of application No. 10/196,166, filed on Jul. 17, 2002.

(30) Foreign Application Priority Data

Aug. 31, 2001 (JP) ............................. 2001-263736

(51) Int. Cl.
*H01L 31/336* (2006.01)

(52) U.S. Cl. ...................... 438/257; 438/258; 438/262

(58) Field of Classification Search ........ 438/257–265; 257/314–324

See application file for complete search history.

(56) References Cited

U.S. PATENT DOCUMENTS

| 5,251,168 A | 10/1993 | Chung et al. ................. 365/51 |
| 5,946,230 A * | 8/1999 | Shimizu et al. ............. 257/314 |
| 5,946,320 A | 8/1999 | Decker .................. 365/185.01 |
| 6,590,254 B1 | 7/2003 | Tanaka ...................... 257/315 |

FOREIGN PATENT DOCUMENTS

| JP | 2-111075 | 4/1990 |
| JP | 5-235366 | 9/1993 |
| JP | 11-54730 | 2/1999 |
| JP | 11-97652 | 4/1999 |
| JP | 11-265891 | 9/1999 |
| JP | 11-284134 | 10/1999 |
| JP | 2001-332708 | 11/2001 |

OTHER PUBLICATIONS

Kim et al., "A Novel 4.6F² NOR Cell Technology With Lightly Doped Source (LDS) Junction For High Density Flash Memories," IEDM (International Electron Devices Meeting), 1998, pp. 979-982.

* cited by examiner

*Primary Examiner*—Cuong Nguyen
(74) *Attorney, Agent, or Firm*—Miles & Stockbridge PC

(57) ABSTRACT

Defects in element forming regions on which memory cells of a non-volatile memory are formed are to be diminished to reduce leakage current. End portions of element forming regions with non-volatile memory cells formed thereon are extended a length D by utilizing the region which underlies a dummy conductive film, whereby a stress induced from an insulating film which surrounds the element forming regions is concentrated on the extended region. As a result, defects do not extend up to the regions where memory cells are formed and therefore it is possible to reduce leakage current in the memory cells.

19 Claims, 17 Drawing Sheets

SEMICONDUCTOR INTEGRATED CIRCUIT DEVICE HAVING A DUMMY CONDUCTIVE FILM AND METHOD OF MANUFACTURING THE SAME

CROSS-REFERENCE TO RELATED APPLICATION

This application is a continuation of application Ser. No. 10/196,166 filed Jul. 17, 2002.

BACKGROUND OF THE INVENTION

The present invention relates to a semiconductor integrated circuit device and a method of manufacturing the same. Particularly, the present invention is concerned with a technique applicable effectively to a semiconductor integrated circuit device in which elongated element forming regions are formed side by side.

A semiconductor integrated circuit device comprises elements and wiring lines formed on main surfaces of element forming regions (active) each defined by an insulating film. For example, the element forming regions are isolated from each other by an element isolation region. The element isolation region is formed for example by an element isolating film. For example, the element isolating film is formed with use of STI (Shallow Trench Isolation) technique. According to this STI technique, an insulating film such as silicon oxide film is deposited on a trench formed in a semiconductor substrate, then the silicon oxide film present outside the trench is removed, for example, by CMP (Chemical Mechanical Polishing), allowing the silicon oxide film to be buried in the interior of the trench, and the trench with the silicon oxide film thus buried therein is used for the isolation between elements.

For example, a memory LSI (Large Scale Integrated Circuit) such as an Electrically Erasable Programmable Read Only Memory (EEPROM) is formed on each of elongated element forming regions arranged side by side at a certain pitch.

With microstructurization and high integration of memory cell, there is a tendency that such element forming regions become smaller in width and are arranged at a narrower pitch.

As to a flash memory of NOR type with a drain contact formed using what is called SAC (Self-Aligned Contact) technique for coping with the tendency to microstructurization of memory cell, it is described, for example, in IEDM (International Electron Devices Meeting), 1998, pp. 979–982, "A Novel 4.6F2NOR Cell Technology With Lightly Doped Source (LDS) Junction For High Density Flash Memories."

SUMMARY OF THE INVENTION

Having made studies about semiconductor memories, especially such a non-volatile memory as mentioned above, the present inventors found out the following problem not publicly known.

Defects of memory cells increase with miniaturization of elements. Through our studies about the cause of such an increase of defects we suspect that a crystal defect which occurs at an end portion of an element forming region may be the cause.

More particularly, in an outer periphery portion of memory cell forming regions within a semiconductor integrated circuit device there exists a peripheral circuit forming region in which are formed a logic circuit, etc. ("peripheral circuits" hereinafter) necessary for driving memory cells. Thus, elongated element forming regions with memory cells formed thereon are arranged at a narrow pitch, and around those regions is disposed another element forming region with peripheral circuits formed thereon. These element forming regions are isolated using a wide insulating film.

Therefore, as will be fully described later in embodiments of the invention, there easily occur stress concentration and crystal defects at end portions of elongated element forming regions with memory cells formed thereon.

Once such a defect occurs, leakage current increases between a drain region of each memory cell and a semiconductor substrate and also between source and drain regions. Moreover, when the leakage current increases larger than the operating current of a sense amplifier, a defect results.

Further, as noted earlier, since plural memory cells are formed on an elongated element forming region, the occurrence of a defect even in one memory cell will lead to defect of all memory cells connected to the same data line as that of the defective memory cell.

It is an object of the present invention to diminish defects of a semiconductor substrate in element forming regions.

It is another object of the present invention to diminish defects of a semiconductor substrate in element forming regions and thereby diminish leakage current.

It is a further object of the present invention to diminish leakage current and thereby improve product yield and reliability.

The above and other objects and novel features of the present invention will become apparent from the following description and the accompanying drawings.

Typical inventions disclosed herein will be outlined below.

(1) A semiconductor integrated circuit device comprising two or more element forming regions each having memory cells formed thereon and defined by an insulating film, the element forming regions each extending in a first direction and being arranged in a second direction perpendicular to t the first direction, end portions of the element forming regions being extended up to below a conductive film which is formed so as to surround the memory cells.

(2) A semiconductor integrated circuit device comprising two or more element forming regions each defined by an insulating film and extending in a first direction, the element forming regions being arranged in a second direction perpendicular to the first direction, end portions of the element forming regions being connected by a connecting portion which extends in the second direction.

(3) A semiconductor integrated circuit device comprising plural element forming regions each having memory cells formed thereon and defined by an insulating film, the element forming regions extending in a first direction and being arranged in a second direction perpendicular to the first direction, wherein the width in the second direction of an outmost element forming region out of the plural element forming regions is made larger than the width of each of the other element forming region(s).

(4) A semiconductor integrated circuit device comprising plural element forming regions each having memory cells formed thereon and defined by an insulating film, the element forming regions extending in a first direction and being arranged in a second direction perpendicular to the first direction, wherein no cell functioning as a memory cell is formed on an outermost element forming region out of the plural element forming regions.

DETAILED DESCRIPTION OF THE PREFERRED EMBODIMENTS

Figure 1:
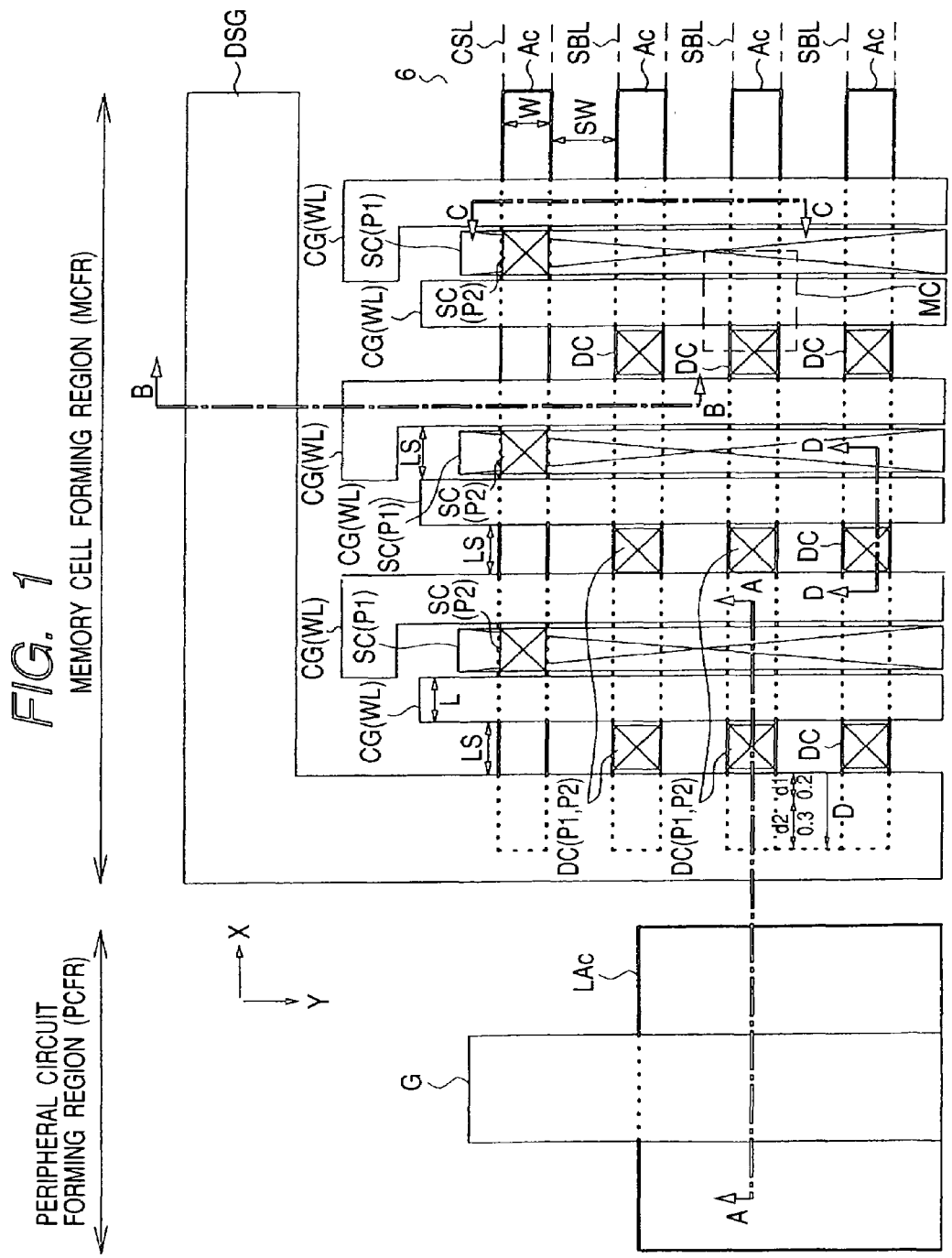
FIG. 1 is a plan view of a principal portion of a substrate, showing a semiconductor integrated circuit device according to a first embodiment of the present invention.

Embodiments of the present invention will be described in detail hereinunder with reference to the accompanying drawings. In all of the drawings for illustrating the embodiments, portions which exhibit the same functions are identified by the same reference numerals and repeated explanations thereof will be omitted.

(First Embodiment)

Figure 2:
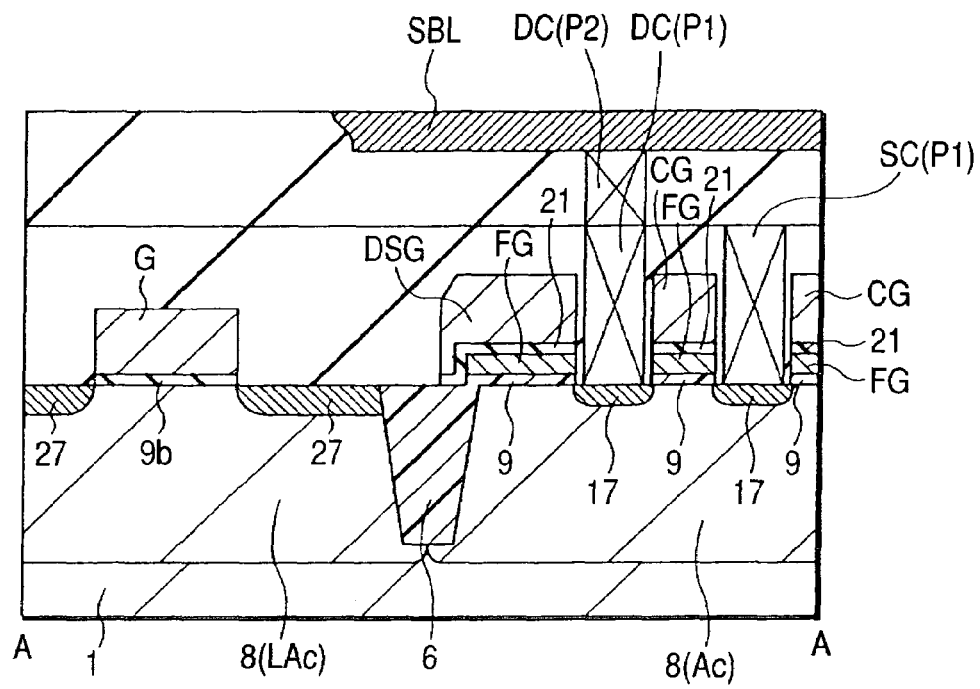
FIG. 2 is a sectional view of a principal portion of the substrate in the semiconductor integrated circuit device of the first embodiment.
Figure 3:
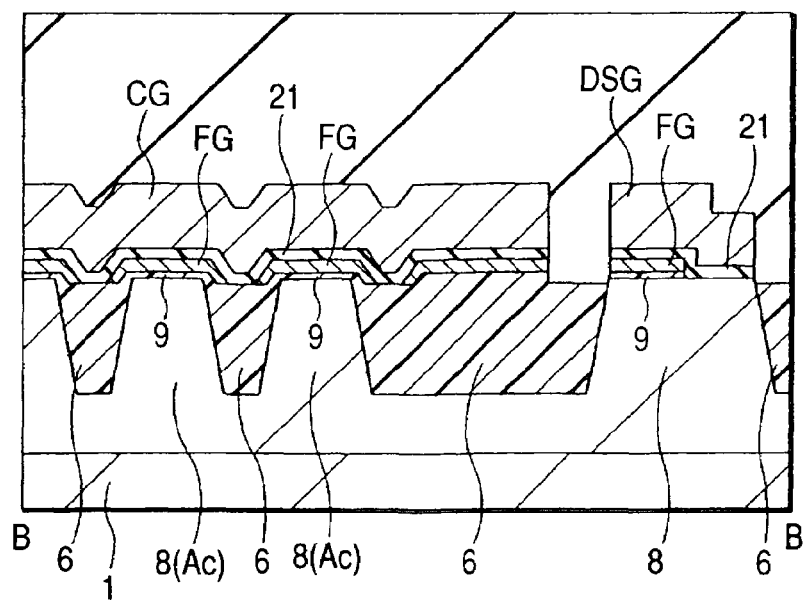
FIG. 3 is a sectional view of a principal portion of the substrate in the semiconductor integrated circuit device of the first embodiment.

FIG. 1 is a plan view of a principal portion of a semiconductor integrated circuit device according to a first embodiment of the present invention. In the same figure, the right-hand portion represents a memory cell forming region MCFR and the left-hand portion represents a peripheral circuit forming region PCFR. In the memory cell forming region MCFR, non-volatile memory cells of NOR type are arranged in the form of an array MCAR, while in the peripheral circuit forming region there are formed MISFETs S for selection as an example of peripheral circuits. FIG. 2 is a schematic sectional view taken on line A—A in FIG. 1 and FIG. 3 is a schematic sectional view taken on line B—B in FIG. 1.

As shown in FIG. 1, in the memory cell forming region, element forming regions (active) Ac each extending in X direction are arranged at predetermined certain pitches in Y direction. The element forming regions Ac are each defined by an insulating film 6, e.g., silicon oxide film. That is, adjacent element forming regions Ac are isolated from each other through the insulating film 6 which is an element isolating film. For example, as shown in FIGS. 2 and 3, the insulating film 6 is formed by STI structure buried in a trench formed in a semiconductor substrate. In the element forming regions Ac, p-type wells 8 are exposed to a surface of a semiconductor substrate 1.

The width W in Y direction of each element forming region is about 0.3 μm for example, the spacing SW between adjacent element forming regions Ac is about 0.4 μm for example, and the length (width in X direction) of each element forming region is about 80 μm in correspondence to, for example, a 128-bit memory cell MC. In each element forming region there are formed plural memory cells MC in X direction.

Above the element forming regions Ac are arranged control gates (second electrodes) CG at predetermined certain pitches, the control gates CG extending in Y direction. The width L in X direction of each control gate CG is about 0.3 μm for example and the spacing LS between adjacent control gates CG is about 0.35 μm for example. The control gates CG are formed integrally with control gates CG of memory cells MC arranged in Y direction and serve as word lines WL extending in Y direction.

Between the control gates CG and the element forming regions Ac, as shown in FIGS. 2 and 3, are formed an insulating film comprising a laminate film ("ONO film" hereinafter) 21 of silicon oxide film, silicon nitride film and silicon oxide film laminated in this order, floating gates (first electrodes) FG, and a gate insulating film 9 formed by a thermal oxide film. The floating gates FG are each formed independently for each memory cell (see FIG. 3).

In each of the element forming regions Ac located at both ends of the control gates CG there are formed $n^+$-type semiconductor regions 17 (source and drain regions). On the drain region 17 is formed a plug (drain contact) DC (P1), while on the source region 17 is formed a plug (source contact) SC (P1). The plug DC (P1) is formed independently for each memory cell, while the plug SC (P1) is connected electrically to each of source regions 17 of memory cells MC connected to one and same word line and constitutes a source line SL extending in Y direction. That is, the plug (source contact) SC (P1) is a wiring line extending in Y direction and constitutes a source line SL. As will be described later, the plugs DC (P1) and SC (P1) are formed in the same manufacturing step.

On the drain region 17 is formed a two-layer structure comprising plugs DC (P1) and DC (P2). On the plug DC (P2) is formed a sub bit line SBL which extends in X direction.

As shown in FIG. 1, the plug SC (P1) is connected to a common source line CSL through the plug SC (P2). The common source line CSL also extends in X direction and is formed by the same wiring layer as the sub bit line SBL. The plugs DC (P2) and SC (P2) are formed in the same manufacturing step.

Thus, each memory cell MC is composed principally of a pair of $n^+$-type semiconductor regions 17 which are source and drain regions, a channel forming region (p-type well)8 (Ac) formed between those semiconductor regions, a gate insulating film 9 formed on the channel forming region, a floating gate FG formed on the gate insulating film 9, an insulating film 21 formed on the floating gate FG, and a control gate CG formed on the insulating film 21. The source and drain regions 17 of memory cells MC adjacent to each other in Y direction are isolated by the insulating film 6 and the control gates CG of memory cells MC arranged in Y direction are formed integrally with the word lines WL. The drain regions 17 of memory cells MC arranged in Y direction are electrically connected to different sub bit lines SBL, and the source regions 17 of memory cells MC arranged in Y direction are electrically connected together through source lines SL. The drain regions of memory cells MC adjacent in X direction are constituted in common and are electrically connected to sub bit lines SBL. Likewise, the source regions 17 of memory cells MC adjacent in X direction are constituted in common and are electrically connected to source lines SL.

The following description is now provided about write, read and erasing operations for each memory cell.

Reference will first be made to a write operation. For writing data to a memory cell, a voltage of 9V for example is applied to the control gate CG (word line WL) of the memory cell, a voltage of 4V for example is applied to the drain region (sub bit line SBL) of the memory cell, a voltage of 3V for example is applied to the element forming region Ac (p-type well 8), and the source region (source line SL) of the memory cell is maintained at, for example, 0V (earth potential). As a result, hot electrons are generated in a channel region (source-to-drain region) of the memory cell and are injected into the floating gate FG.

Next, a description will be given of a read operation. For reading data from the memory cell, a voltage of 2.7V for example is applied to the control gate CG (word line WL) of the memory cell, a voltage of 0.8V for example is applied to the drain region (sub bit line SBL) of the memory cell, and the element forming region Ac (p-type well 8) and the source region (source line SL) of the memory cell are maintained at 0V for example. At this time, data ("1" or "0") of the memory cell is read out in accordance with whether an electric current flows or not between the source and drain regions of the memory cell. If the answer is affirmative, it is seen that electrons are not injected into the floating gate FG of the memory cell (the voltage level is below a threshold voltage) and that, for example, "0" data has been stored. On the other hand, if no current flows, it is seen that electrons are injected into the floating gate FG of the memory cell (the voltage level is above the threshold voltage) and that, for example, "1" data has been stored.

A description will not be directed to an erasing operation. For erasing data stored in the memory cell, a voltage of 10.5V for example is applied to the control gate CG (word line WL) of the memory cell, a voltage of 10.5V for example is applied to the element forming region Ac (p-type well 8) and the drain region (sub bit line SBL) of the memory cell, and the source region (source line SL) of the memory cell is maintained in a floating state (open state). As a result, by FN (Fowler-Nordheim) tunneling, electrons are released from the control gate CG to the channel region (source-to-drain region) of the memory cell.

A dummy conductive film DSG is formed in an outer periphery portion of the memory cell array by the same layer as the control gates CG. The dummy conductive film DSG is formed for diminishing the influence of dust particles developed during the formation of memory cells and for eliminating the difference in height between the memory cell forming region and the peripheral circuit forming region.

The dummy conductive film DSG is also formed on the element forming regions (p-type wells 8), and also between the dummy conductive film DSG and each element forming region Ac are formed an insulating film, e.g., ONO film 21, a floating gate (first electrode) FG, and a gate insulating film 9, e.g., a thermal oxide film, (see FIGS. 2 and 3).

Also in the peripheral circuit forming region are formed element forming regions LAc for peripheral circuits. On the element forming regions LAc is formed a conductive film which constitutes gate electrodes G in MISFETs S for selection. As shown in FIG. 2, the gate electrodes G are formed by the same layer as the control gates CG and a gate insulating film 9b is formed under the gate electrodes G. In the element forming region LAc at both ends of each gate G are formed $n^+$-type semiconductor regions 27 (source and drain regions).

As shown in FIG. 1, the element forming regions Ac in the memory cell forming region each extend a length D in X direction from the drain region end of the memory cell located at an endmost position. In the length D, the distance d1 is a distance taking into account a displacement of a mask which is used in forming the element forming region Ac, while the distance d2 is a distance taking into account a crystal defect developing region. In this embodiment, d1 is about 0.2 µm and d2 is about 0.3 µm. This magnitude of d2 was set on the basis of the fact that the length of a crystal defect developed in an element forming region Ac during formation of memory cells in accordance with the foregoing rule was about 0.3 µm.

Thus, in this embodiment, since an end portion of each element forming region Ac is extended, it is possible to avoid the influence of a crystal defect developed in the element forming region Ac. Consequently, it is possible to diminish the generation of leakage current and hence possible to decrease the rate of occurrence of memory cell defects.

Figure 4:
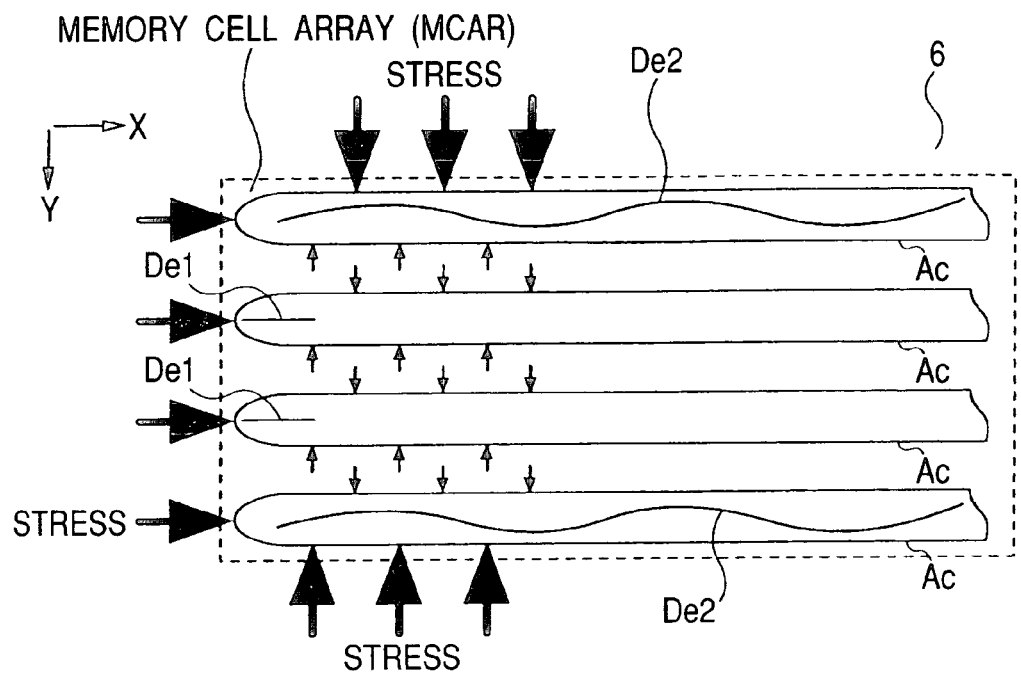
FIG. 4 is a plan view of a principal portion of the substrate in the semiconductor integrated circuit device of the first embodiment.
Figure 5:
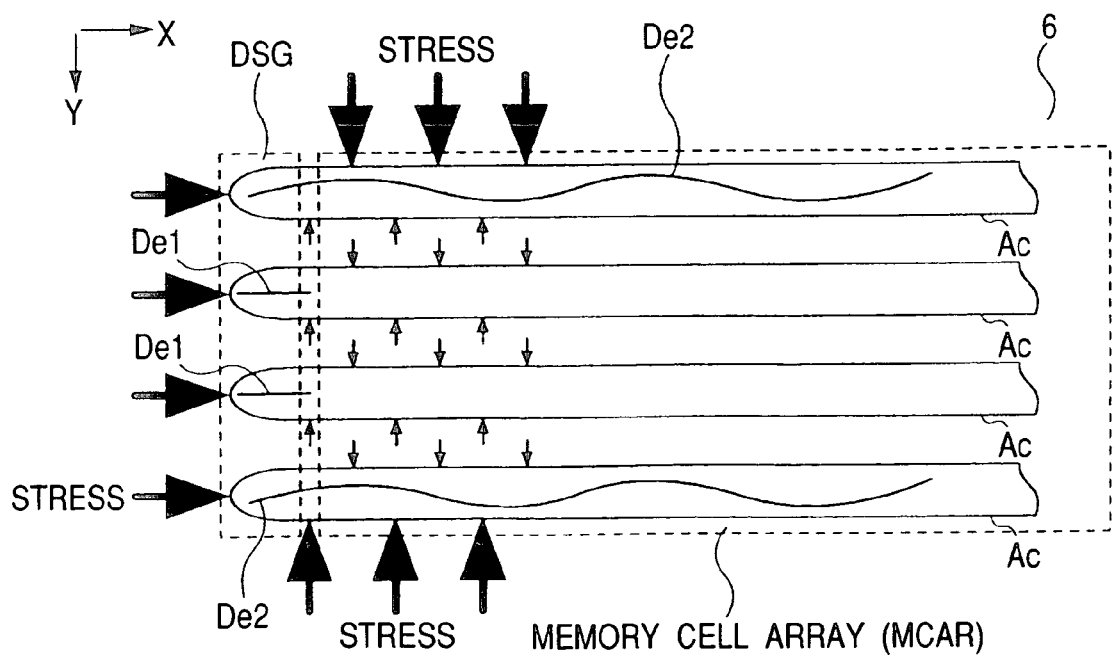
FIG. 5 is a plan view of the principal portion.

More particularly, as shown in FIG. 4, the insulating film 6 is present between adjacent element forming regions Ac and a stress induced by the insulating film 6 present along the outer peripheries of element forming regions Ac is imposed on the regions Ac. Particularly, since the insulating film 6 is formed over a wide range in the outer periphery portion of the memory cell forming region for the purpose of isolation form the peripheral circuit, there occurs a stress concentration at end portions of the element forming regions Ac. With such a large stress, there occur defects (De1, De2) such as dislocation within crystals which constitute the element forming regions Ac. Leakage current occurs through the defects, and if the leakage current becomes larger than the operating current of the sense amplifier, a defect results as noted earlier.

In this embodiment, however, since end portions of the element forming regions Ac are extended, the defect De1 does not extend to the region (memory cell array MCAR) where substantial memory cells are formed, so that it is possible to diminish the leakage current in each memory cell.

On the extended portion of each element forming region Ac is formed a dummy conductive film DSG, and below the DSG are formed an insulating film, e.g., ONO film 21, a floating gate (first electrode) FG, and a gate insulating film 9, e.g., thermal oxide film. Thus, this structure is a pseudo memory cell structure, provided a source region is not present. However, the dummy conductive film DSG is not applied with any potential and is in a floating state, so that no channel is formed, with no generation of leakage current.

In this embodiment, since each element forming region Ac is extended by utilizing the space which underlies the dummy conductive film DSG, it is possible to take the measure against defects without enlarging the memory cell forming region.

Next, an example of a method for manufacturing the semiconductor integrated circuit device of this embodiment will be described below. FIGS. 6 to 12 are sectional views of a principal portion of a substrate, showing how to manufacture the semiconductor integrated circuit device of this embodiment, of which FIGS. 6 to 8 correspond to C—C section in FIG. 1 and FIGS. 9 to 12 correspond to D—D section in FIG. 1.

Figure 6:
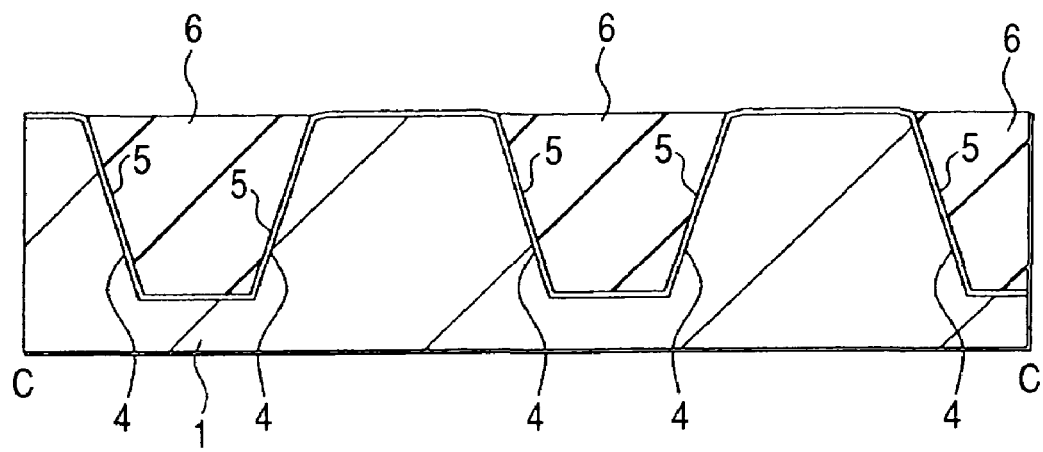
FIG. 6 is a sectional view of a principal portion of the substrate, showing a method of manufacturing the semiconductor integrated circuit device of the first embodiment.

First, as shown in FIG. 6, a semiconductor substrate 1, which is formed by a p-type single crystal silicon having a resistivity of 1 to 10 Ωcm or so, is thermally oxidized to form a pad oxide film (not shown) on the surface of the semiconductor substrate 1. Next, an insulating film, e.g., silicon nitride film (not shown), is deposited on the pad oxide film, and the silicon nitride film present on an element isolation region is removed using a photoresist film (simply "resist film" hereinafter) as mask.

Next, the resist film is removed and the semiconductor substrate 1 is etched using the silicon nitride film as mask to form element isolation trenches 4 having a depth of about 250 nm.

Thereafter, the semiconductor substrate 1 is subjected to dry oxidation at about 1150° C. to form a thermal oxide film such as a silicon oxide film 5 having a thickness of about 30 nm on inner walls of the trenches. The silicon oxide film 5 is formed for remedying damages caused by dry etching on the inner walls of the trenches and for relieving stress induced at the interface between a silicon oxide film 6 to be buried within the trenches in the next step and the semiconductor substrate 1.

Next, an insulating film constituted by a silicon oxide film 6 having a thickness of about 600 nm for example is deposited on the semiconductor substrate 1 including the interiors of the element isolation trenches 4 by CVD, followed by heat-treatment (annealing) at 1150° C. for 60 minutes to density the silicon oxide film 6. Then, the silicon oxide film 6 present on the trenches is polished by CMP to flatten the film surface and thereafter the silicon nitride film is removed. At this time, the surface of the silicon oxide film 6 projects from the surface of the semiconductor substrate 1 by an amount corresponding to the thickness of the silicon nitride film, but the surface of the silicon oxide film 6 will retract gradually by subsequent washing step for the semiconductor substrate 1 and surface oxidation and oxide film removing step.

Through the above steps there is formed an element isolation region with silicon oxide film 6 buried within the element isolation trenches 4.

Figure 7:
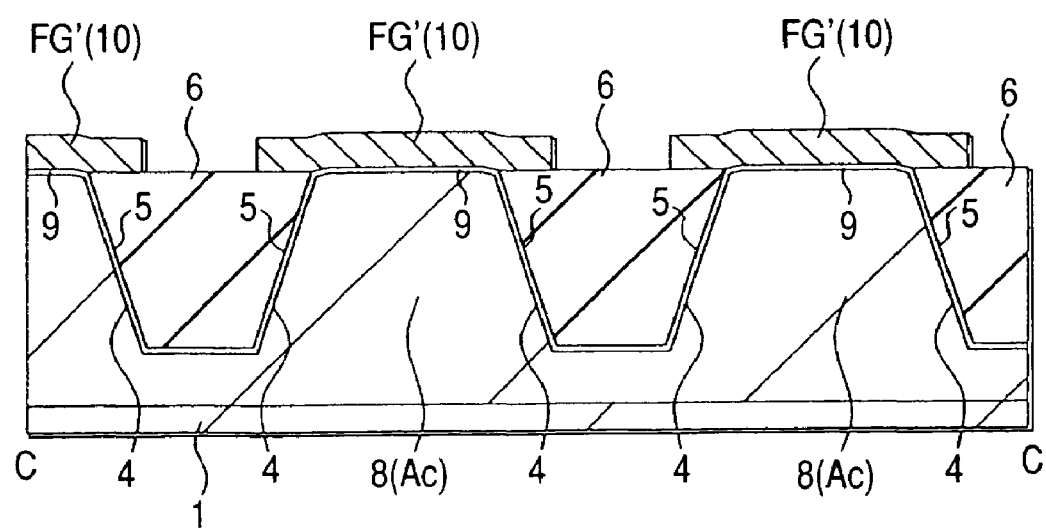
FIG. 7 is a sectional view of the substrate principal portion in the manufacturing method.

Next, as shown in FIG. 7, the surface of the semiconductor substrate 1 is subjected to wet washing and thereafter the semiconductor substrate 1 is thermally oxidized for example to form an insulating film such as a through oxide film (not shown). Then, a p-type impurity (boron for example) is ion-implanted into the semiconductor substrate 1, followed by heat treatment to diffuse the impurity, thereby forming p-type wells 8 in the memory cell forming region. The regions where the p-type wells 8 are exposed to the surface of the semiconductor substrate 1 serve as element forming regions Ac. Also in the peripheral circuit forming region is formed an element forming region LAc in the same manner.

Next, a thermal oxide film having a thickness of about 8 nm for example is formed on the surface of each p-type well 8 by thermal oxidation (pre-oxidation), thereafter the thermal oxide film is removed and the surface of the semiconductor substrate 1 (p-type wells 8) is made clean, followed by heat treatment to form a thermal oxide film having a thickness of about 10.5 nm for example. This thermal oxide film constitutes a gate insulating film of a non-volatile memory cell.

Next, a conductive film such as a phosphorus-doped polycrystalline silicon film 10 having a thickness of about 100 nm for example is deposited on the gate insulating film 9 by CVD. Then, the polycrystalline silicon film 10 is dry-etched using a resist film (not shown) as mask to form stripe-like patterns FG' (10) in the memory cell forming region which patterns FG' (10) have a longitudinal direction in X direction.

Figure 8:
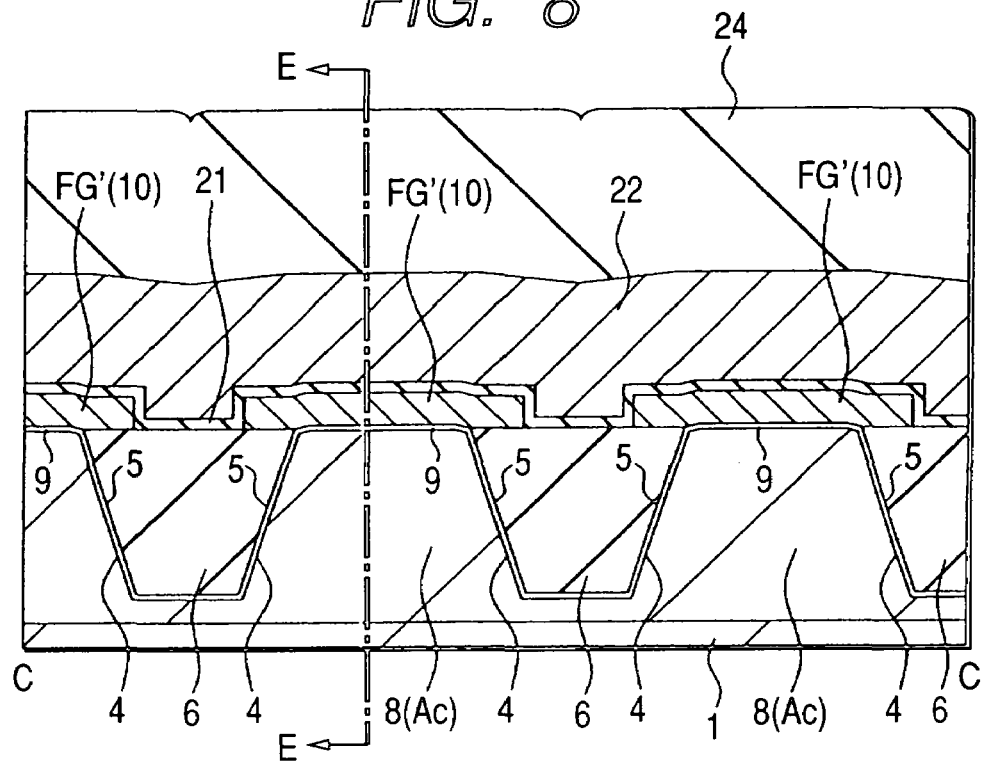
FIG. 8 is a sectional view of the substrate principal portion in the manufacturing method.

Next, as shown in FIG. 8, an insulating film such as ONO film 21 is formed on the semiconductor substrate 1 to separate the patterns FG' (10) from control gates CG to be described later. The ONO film 21 is a laminate film comprising silicon oxide film, silicon nitride film, and silicon oxide film and is formed, for example, by laminating a silicon oxide film about 5 nm thick, a silicon nitride film about 7 nm thick, and a silicon oxide film about 4 nm thick in this order in accordance with CVD. A silicon nitride film of about 10 nm may be further deposited on the top silicon oxide film.

In the peripheral circuit forming region, the ONO film 21, polycrystalline silicon film 10, and the gate insulating film 9, which are formed on the same region, are removed. Then, the surface of the semiconductor substrate 1 in the peripheral circuit forming region is subjected to wet washing and thereafter a gate insulating film 9b having a thickness of about 8 nm is formed on the surface of each p-type well 8 in the peripheral circuit forming region. The gate insulating film 9b serves as the gate insulating film 9b in the MISFETs S for selection formed in the peripheral circuit forming region (see FIG. 2).

Next, a polycrystalline silicon film 22 doped with phosphorus about $4.75 \times 10^{20}/cm^3$ is formed as a conductive film on the semiconductor substrate 1 by deposition of about 200 nm in accordance with CVD. On the polycrystalline silicon film 22 is then deposited such an insulating film as silicon nitride film 24 of about 300 nm by CVD. The polycrystalline silicon film 22 serves as the gate electrodes G in the MISFETs S for selection formed in the peripheral circuit forming region and also serves as the control gate CG of each non-volatile memory cell formed in the memory cell forming region.

Figure 9:
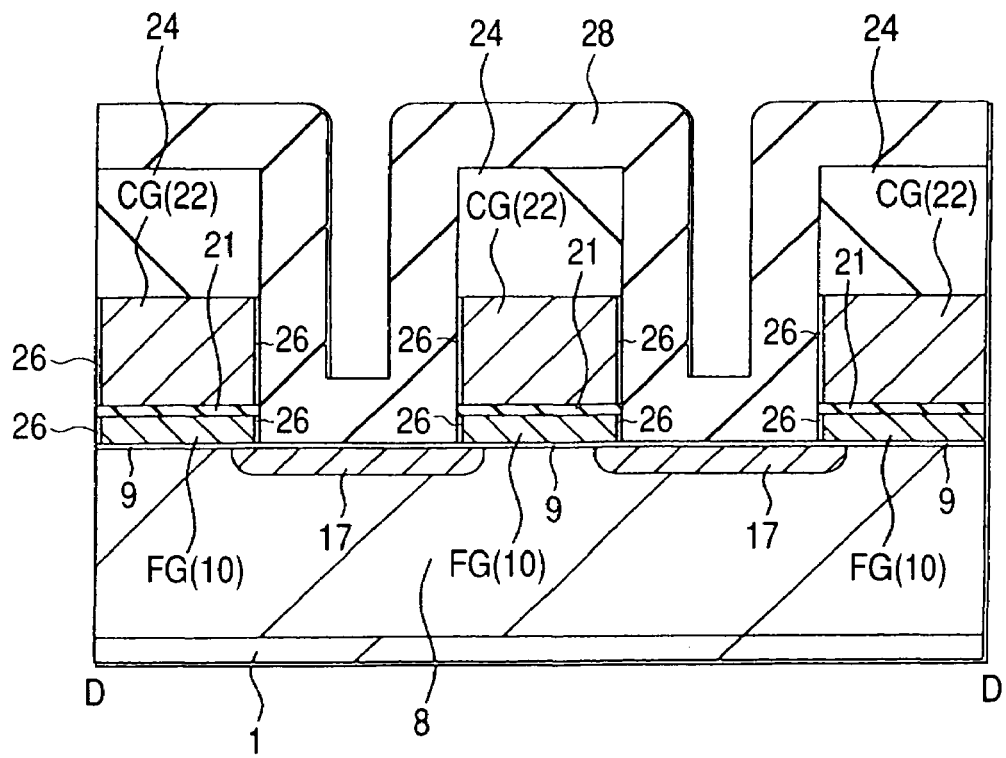
FIG. 9 is a sectional view of the substrate principal portion in the manufacturing method.

Next, as shown in FIG. 9, using the resist film (not shown) in the memory cell forming region as mask, the silicon nitride film 24, polycrystalline silicon film 22, ONO film 21, and pattern FG' (polycrystalline silicon-film 10) are subjected to dry etching.

With this dry etching, there are formed control gates CG (22) constituted by the polycrystalline silicon 22 and floating gates FG (10) constituted by the polycrystalline silicon film 10. The floating gates FG (10) are divided memory cell by memory cell which are arranged in X direction, while the control gates CG are formed so as to extend in Y direction and constitute word lines WL. The control gates CG are not limited to the polycrystalline silicon film 22, but may be formed by a single film of a high-melting, or refractory, metal or silicide, or a laminate film thereof, or a laminate film of a polycrystalline film and a refractory film or silicide film. FIG. 9 corresponds to E—E section in FIG. 8 and D—D section in FIG. 1.

In the peripheral circuit forming region, using a resist film (not shown) as mask, the silicon nitride film 24 and the polycrystalline silicon film 22 are subjected to dry etching to form the gate electrodes G in the MISFETs S for selection (see FIG. 2).

Next, an n-type impurity (arsenic for example) is ion-implanted into each p-type well 8 in the memory cell forming region, followed by heat treatment to diffuse the impurity, thereby forming $n^+$-type semiconductor regions 17 (source and drain regions). At this time, there may be formed a channel-implantation region (not shown) by oblique ion-implantation of a p-type impurity (for example, boron).

In the peripheral circuit forming region, heat treatment is performed after ion-implanting an n-type impurity (arsenic for example) into the p-type wells 8, allowing the impurity to be diffused, to form n-type semiconductor regions (not shown) on both sides of each gate electrode G.

Next, a lightly oxidized film (thermal oxide film) 26 is formed on side walls of the polycrystalline films 10 and 22 by heat treatment (light oxidation) at 850° C. The lightly oxidized film 26 is formed under the same conditions as in forming an about 10 nm thick silicon oxide film on the surface of a silicon substrate. This film is formed for remedying damages induced at end portions of the gate insulating film 9 during etching of the floating gates FG (polycrystalline silicon film 10) and control gates (polycrystalline silicon film 22) described above.

Subsequently, such an insulating film as a silicon nitride film 28 is formed on the semiconductor substrate 1 by CVD for example.

In the peripheral circuit forming region, side wall spacers (not shown) are formed on side walls of each gate electrode G in the same region. Next, an n-type impurity (phosphorus P or arsenic As) is ion-implanted to the p-type wells 8 in the peripheral circuit forming region and heat treatment is conducted at 950° C. for 10 seconds to diffuse the impurity, thereby forming $n^+$-type semiconductor regions 27 (source and drain regions) in the MISFETs S for selection.

Through the above steps, in the memory cell forming region there are formed NOR type non-volatile memory cells each having control gate CG (polycrystalline silicon film 22), ONO film 21, floating gate FG (polycrystalline film 10), and gate insulating film 9, and MISFETs S for selection are formed in the peripheral circuit forming region.

Figure 10:
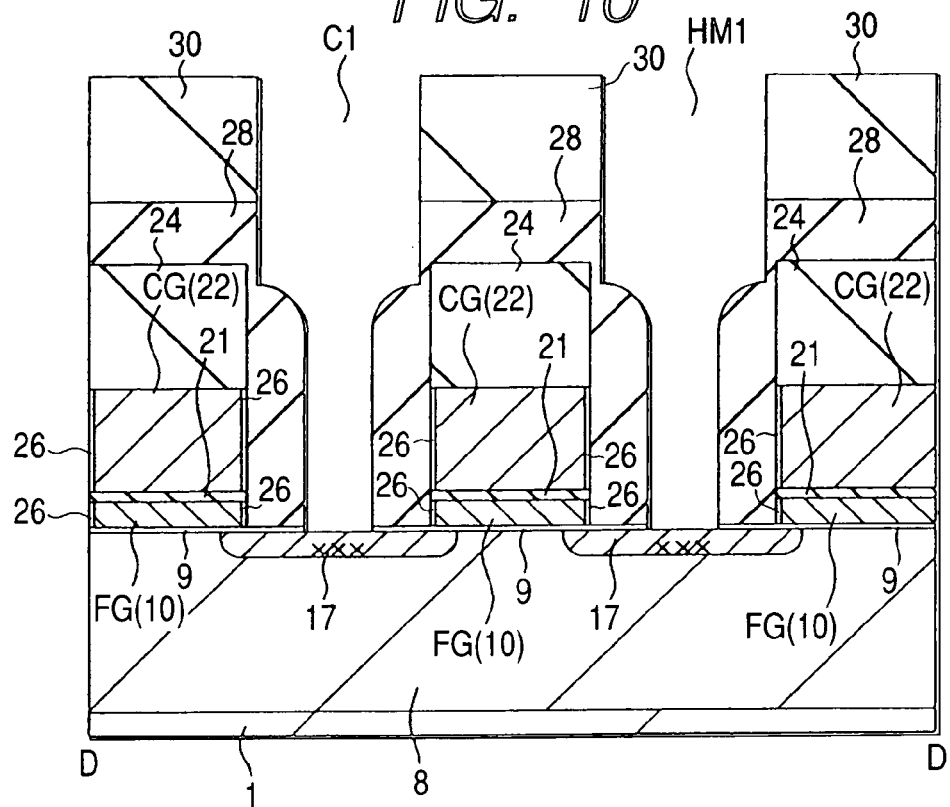
FIG. 10 is a sectional view of the substrate principal portion in the manufacturing method.

Then, as shown in FIG. 10, an insulating film such as a silicon oxide film 30 of 200 nm or so is formed by CVD on the silicon oxide film 28, thereafter, for forming patterns of plugs DC (P1) and SC (P1) shown in FIG. 1 onto the silicon oxide film 30, the silicon oxide film 30 is subjected to dry etching through a resist film (not shown) as mask and then the silicon nitride film 28 is dry-etched to form a contact hole C1 and a wiring trench HM1 on the $n^+$-type semiconductor regions 17 (source and drain regions). More specifically, the contact hole C1 and the wiring trench HM1 are formed on the drain region (17) and the source region (17), respectively.

The etching for the silicon oxide film 30 is performed under such a condition as makes the etching rate of silicon oxide large relative to silicon nitride to prevent complete removal of the silicon nitride film 28.

The etching for the silicon nitride film 28 is performed under such a condition as makes the etching rate of silicon nitride large relative to silicon oxide to prevent the substrate 1 and the silicon oxide film from being etched deep. Further, this etching is conducted under a condition such that the silicon nitride film 28 is etched anisotropically to let the silicon nitride film 28 remain on side walls of the control gates CG and floating gates FG. In this way, contact holes C1 having a fine diameter smaller than the minimum size which is determined by the resolution limit of photolithography, as well as wiring trenches HM1 having a fine width, are formed self-alignmentwise relative to control gates CG and floating gates FG.

Next, an n-type impurity (arsenic for example) is ion-implanted through the contact holes C1 and wiring trenches HM1, followed by heat treatment to diffuse the impurity, thereby forming $n^+$-type semiconductor regions 19. The $n^+$-type semiconductor regions 19 are formed for diminishing the resistance of contact thereof with plugs formed in the contact holes C1.

Figure 11:
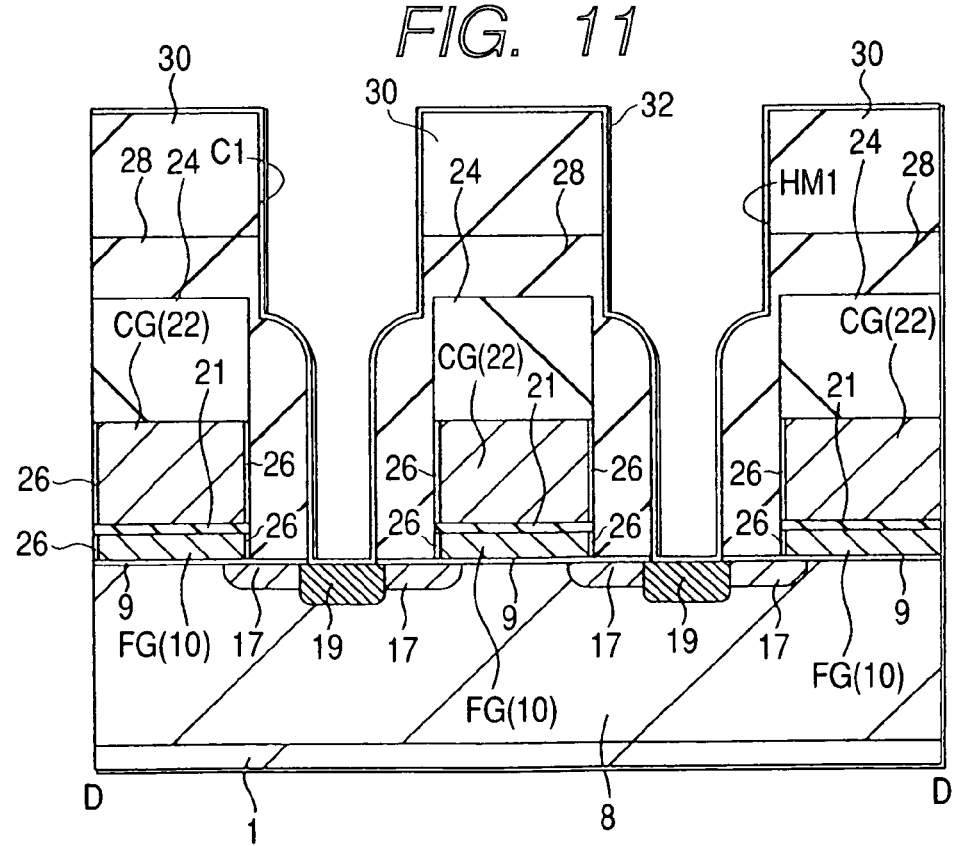
FIG. 11 is a sectional view of the substrate principal portion in the manufacturing method.

Than, as shown in FIG. 11, an insulating film such as a thin silicon nitride film 32 is formed on the silicon oxide film 30 including the interiors of the contact holes C1 and wiring trenches HM1. Subsequently, the silicon nitride film 32 present on the silicon oxide film 30 and on the bottoms of the contact holes C1 and wiring trenches HM1 is removed by etching back. The silicon nitride film 32 is formed for preventing short-circuit between plugs when the silicon oxide film 30 on the control gates CG is etched during washing of the semiconductor substrate 1 which will be described later.

Next, the semiconductor substrate 1 is washed using a fluoric acid-based washing solution for example and thereafter a conductive film is deposited on the silicon oxide film 30 including the contact holes C1 and wiring trenches HM1. For example, Ti (titanium) of about 10 nm and TiN (titanium nitride) of about 80 nm are deposited (not shown) successively by sputtering and W (tungsten) film is further deposited about 350nm by CVD.

Then, the conductive film comprising W, TiN and Ti films present outside the contact holes C1 and wiring trenches HM1 is removed by CMP to form plugs P1. More specifically, plugs DC (P1) are formed within the contact holes C1 on drain regions (17), while plugs SC (P1) are formed within the wiring trenches HM1 on source regions (17). As noted earlier, the plugs SC (P1) are wiring lines extending in Y direction and constitute source lines SL.

Next, an insulating film such as a silicon oxide film 35 is deposited about 300 nm on the silicon oxide film 30 including the portions located above the plugs P1 by CVD for example.

Figure 12:
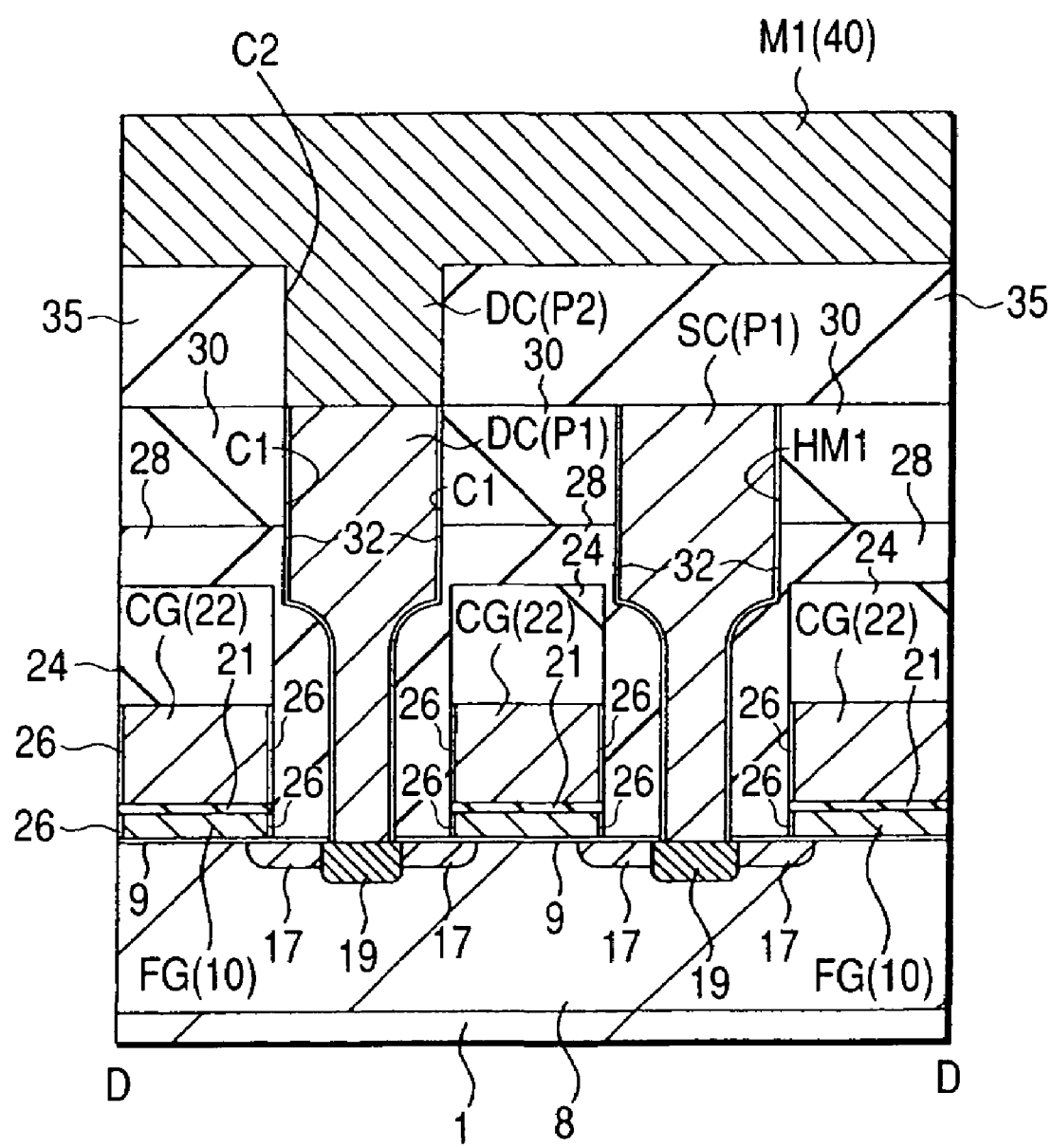
FIG. 12 is a sectional view of the substrate principal portion in the manufacturing method.

Then, contact holes C2 are formed by removing the silicon oxide film 35 on the plugs P1. In FIG. 12 there appears only a contact hole C2 on plug DC (P1) on the drain region. A contact hole C2 on plug SC (P1) on the source region appears in a section different from FIG. 12.

Subsequently, a conductive film is deposited on the silicon oxide film 35 including the interiors of the contact holes C2. For example, W film (not shown) is deposited about 10 nm by sputtering, followed by further deposition of W film about 250nm by CVD.

Next, the conductive film comprising W film 40, etc. is subjected to dry etching with a resist film (not shown) as mask to form first-layer wiring lines M1 and connections (plugs P2) between the first-layer wiring lines M1 and the plugs P1. That is, plugs DC (P2) and SC (P2) are formed. The first-layer wiring lines M1 in the figure correspond to the sub bit lines SBL in FIG. 1, while a first-layer wiring line M1 on plug SC (P2) not appearing in the section of FIG. 12 serves as a common source line CSL.

Thereafter, an insulating film such as silicon oxide film is deposited on the silicon oxide film 35 including the portions located above the first-layer wiring lines M1 by CVD for example. Further, a conductive film comprising W film is deposited on the insulating film to form second-layer wiring lines, which are not shown.

The semiconductor integrated circuit device manufacturing method described above in detail involves various heat treatment steps such as 1) heat treatment for densifying the silicon oxide film 6, 2) heat treatment for forming a through oxide film, 3) oxidation (pre-oxidation) for cleaning the surface of the semiconductor substrate (p-type well 8), 4) heat treatment in forming the gate insulating film 9, and 5) heat treatment in forming the lightly oxidized film 26.

In such heat treatment steps, the silicon oxide film 6 buried in the interior of each trench formed in the semiconductor substrate, especially the thin thermal oxide film (silicon oxide film 5) formed to remedy a damage in the inner wall of the trench caused by dry etching, becomes oxidized more and more, with consequent increase of a stress imposed on the element forming regions.

Also by ion implantation at the time of forming $n^+$-type semiconductor regions 17 (source and drain regions) and $n^+$-type semiconductor regions 19, stress is imposed on the element forming regions.

Further, since the silicon nitride film is large in film stress, the imposition of stress on the element forming regions occurs also at the time of depositing the silicon nitride film 28 which is used for self-alignmentwise formation of contact holes C1 and wiring trenches HM1 for example.

According to this embodiment, however, as noted earlier, end portions of the element forming regions Ac are extended, so even under the aforesaid application of stress, defects do not extend up to the region where memory cells are formed and there can be attained an effect of diminishing leakage current in memory cells.

(Second Embodiment)

Figure 13:
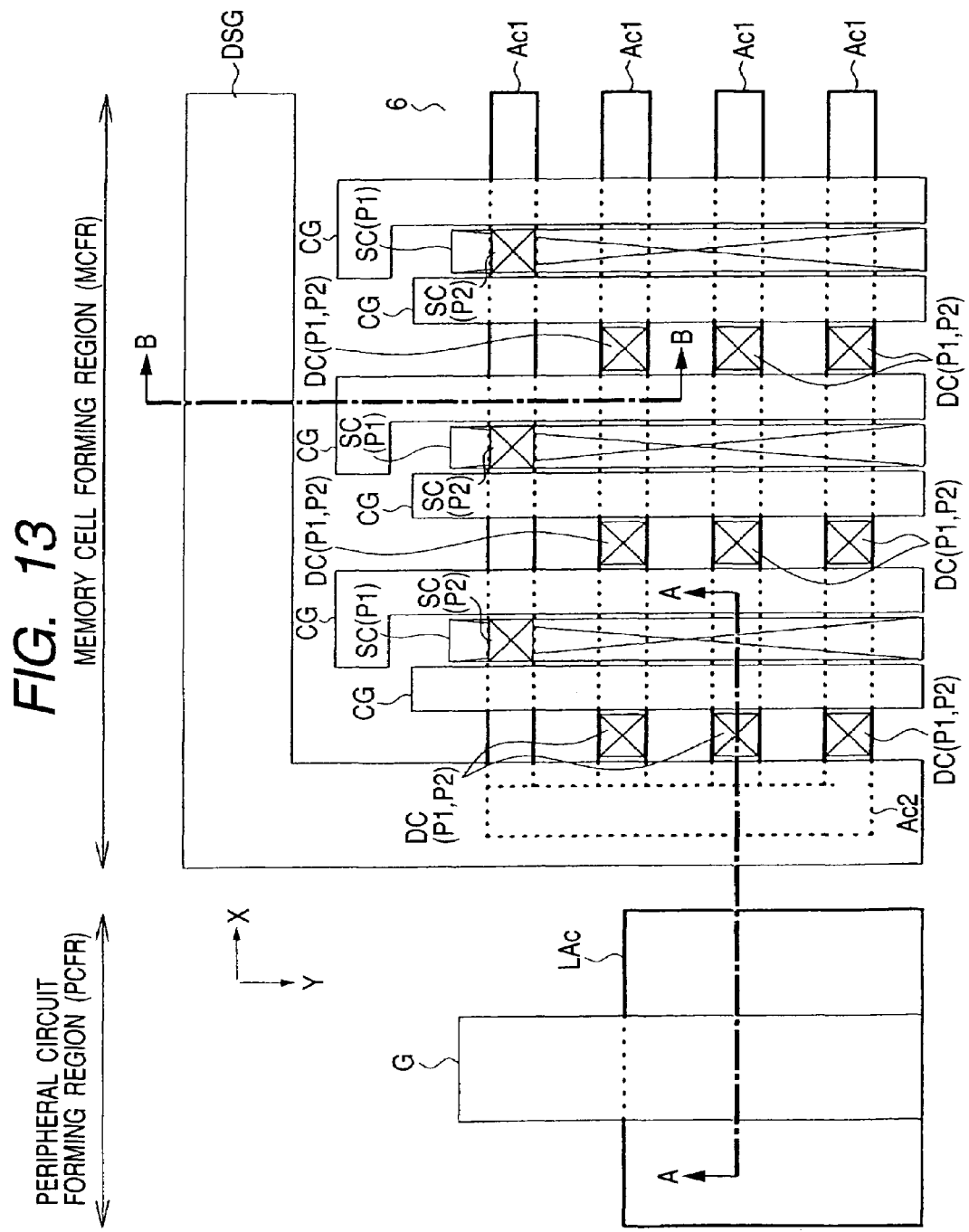
FIG. 13 is a plan view of a principal portion of a substrate, showing a semiconductor integrated circuit device according to a second embodiment of the present invention.
Figure 14:
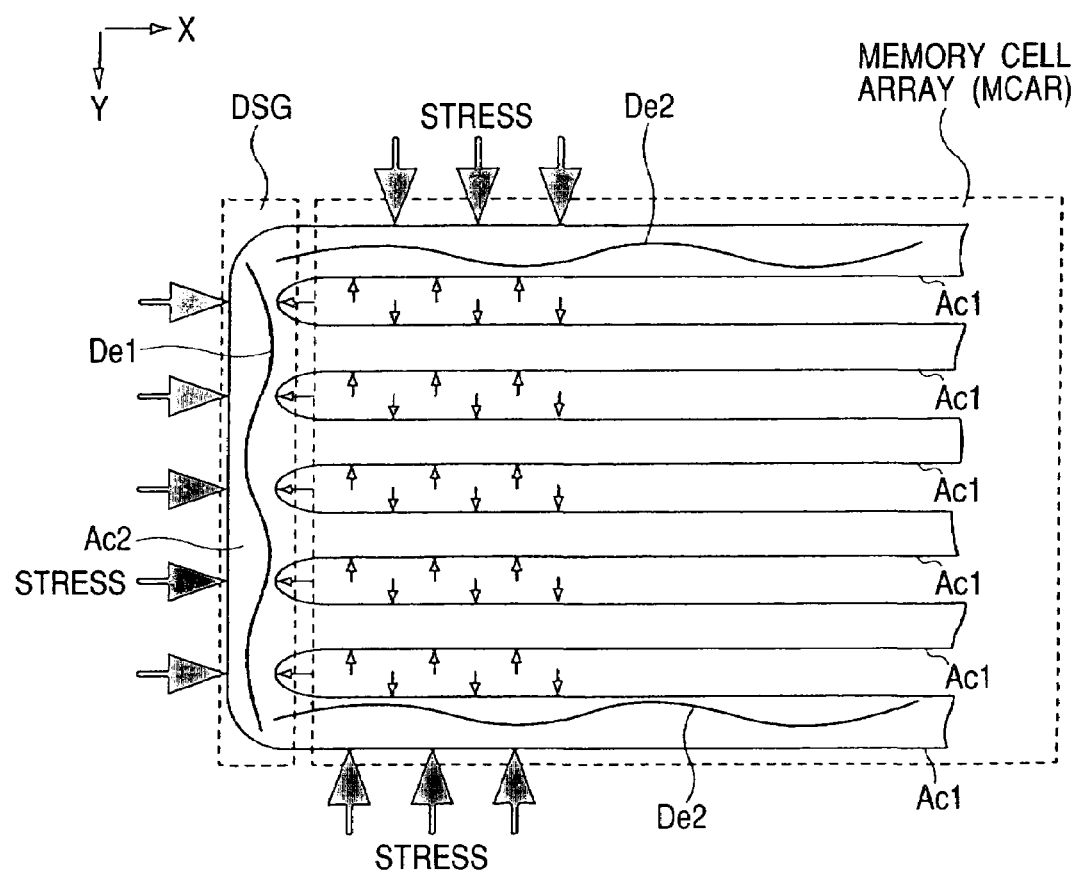
FIG. 14 is a plan view of a principal portion of the substrate in the semiconductor integrated circuit device of the second embodiment.

FIG. 13 is a plan view of a principal portion of a semiconductor integrated circuit device according to a second embodiment of the present invention. In FIG. 13, the right-hand portion represents a memory cell forming region MCFR, while the left-hand portion represents a peripheral circuit forming region PCFR. In the memory cell forming region there are formed MISFETs S for selection as an example of peripheral circuits. The construction of the semiconductor integrated circuit device of this second embodiment, as is seen from a comparison thereof with FIG. 1, is the same as that of the first embodiment except that end portions of element forming regions Ac1 are connected together through a connecting portion Ac2. Therefore, a detailed description thereof will here be omitted and only a characteristic portion will be described.

In the memory cell forming region, as shown in FIG. 13, element forming regions Ac1 each extending in X direction are arranged in Y direction at predetermined certain pitches and end portions thereof are connected together through a connecting portion Ac2 which extends in Y direction.

Thus, in this embodiment, since end portions of the element forming regions Ac1 are connected together through the connecting portion Ac2, it is possible to change the direction in which stress is applied. Therefore, in addition to the effect obtained in the previous first embodiment, there is further obtained an effect of relaxing the concentration of stress on the element forming regions Ac1. As a result, a defect Del does not extent up to the region (memory cell array MCFR) where substantial memory cells are formed and hence it is possible to diminish leakage current in memory cells.

Figure 15:
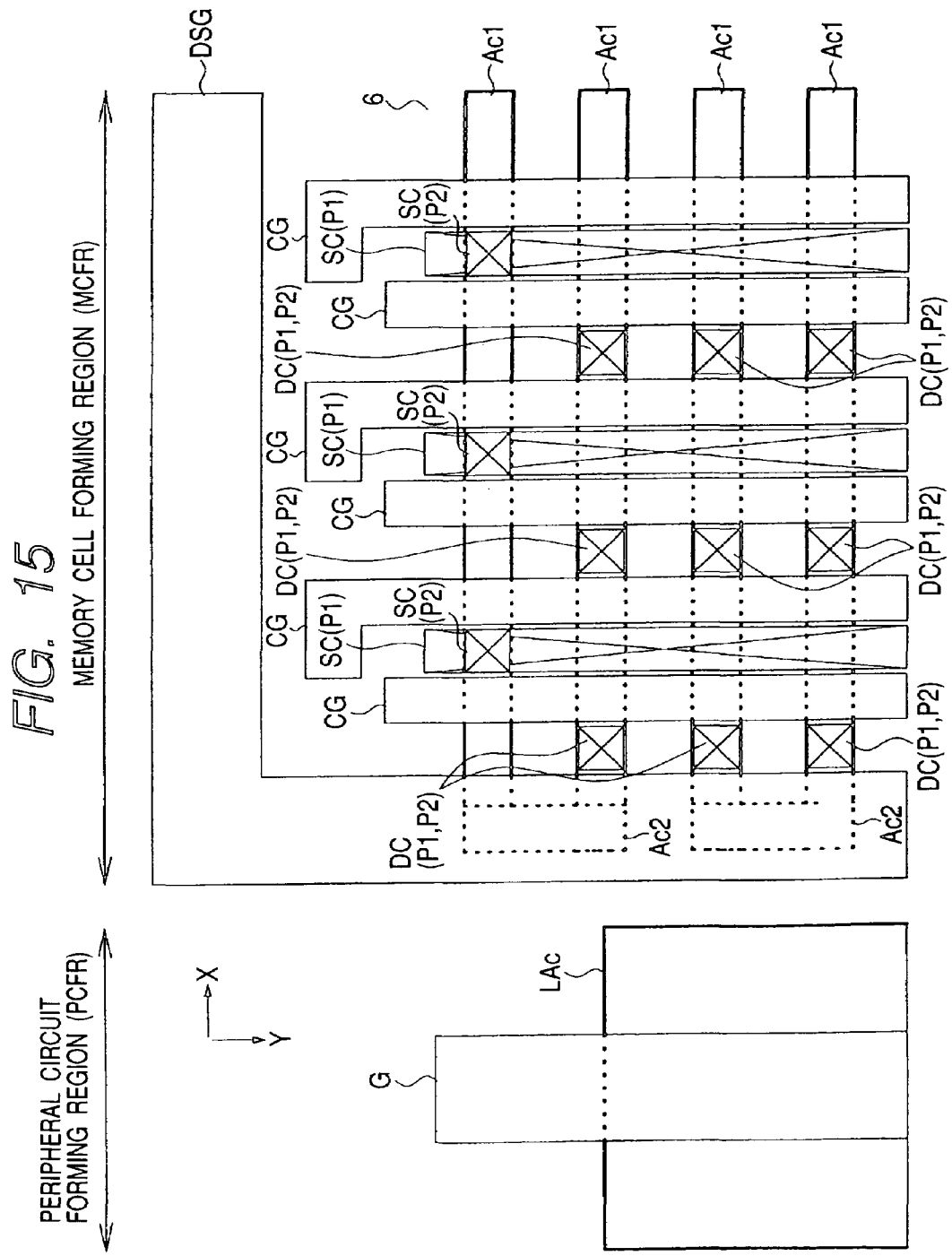
FIG. 15 is a plan view of a principal portion of the substrate in the semiconductor integrated circuit device of the second embodiment.

Although in FIG. 13 all of the element forming regions Ac1 are connected together through the connecting portion Ac2, connecting portions Ac2 may be provided each for a certain number of element forming regions Ac1 (every two element forming regions Ac1 in FIG. 15), as shown in FIG. 15.

(Third Embodiment)

Figure 16:
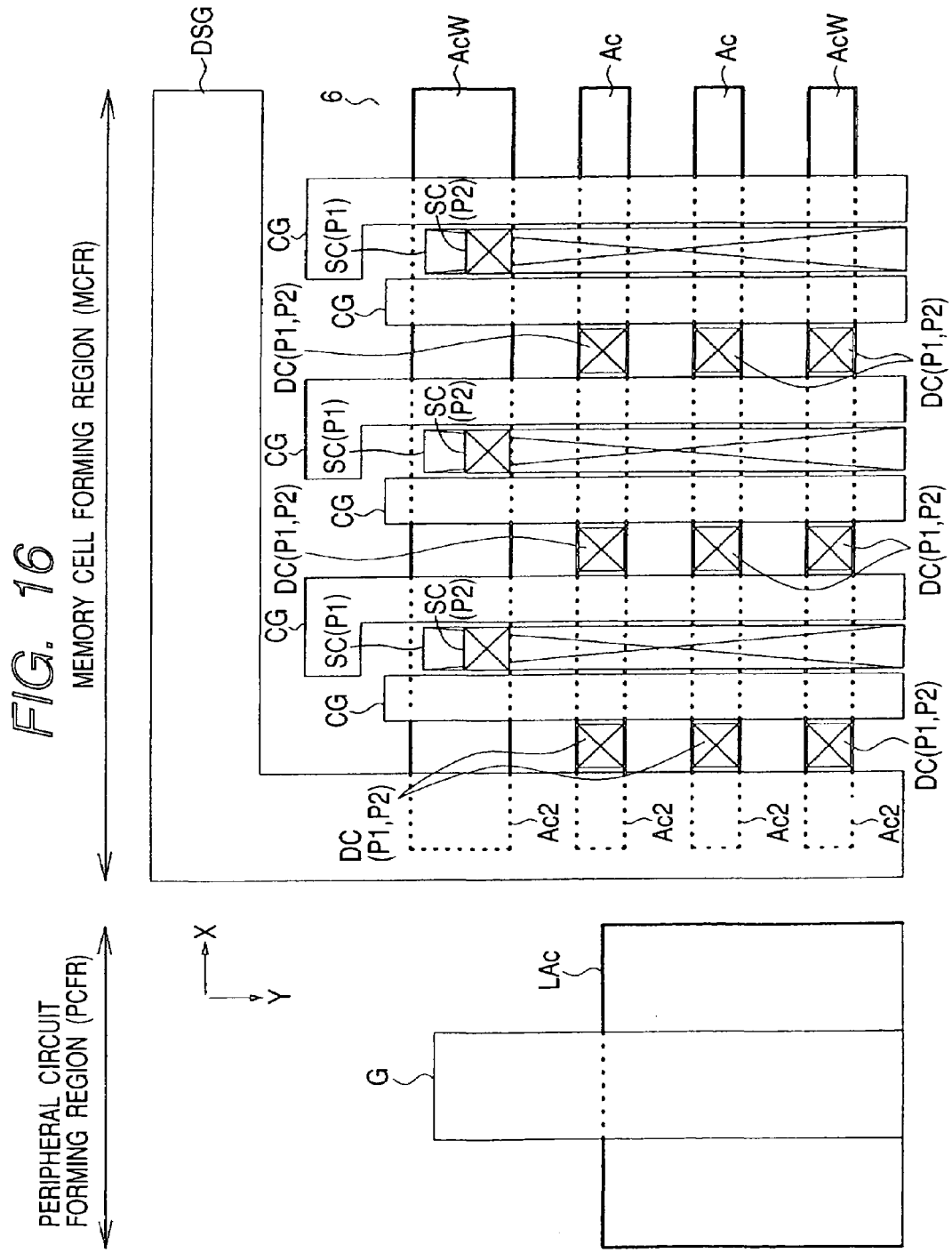
FIG. 16 is a plan view of a principal portion of a substrate, showing a semiconductor integrated circuit device according to a third embodiment of the present invention.
Figure 17:
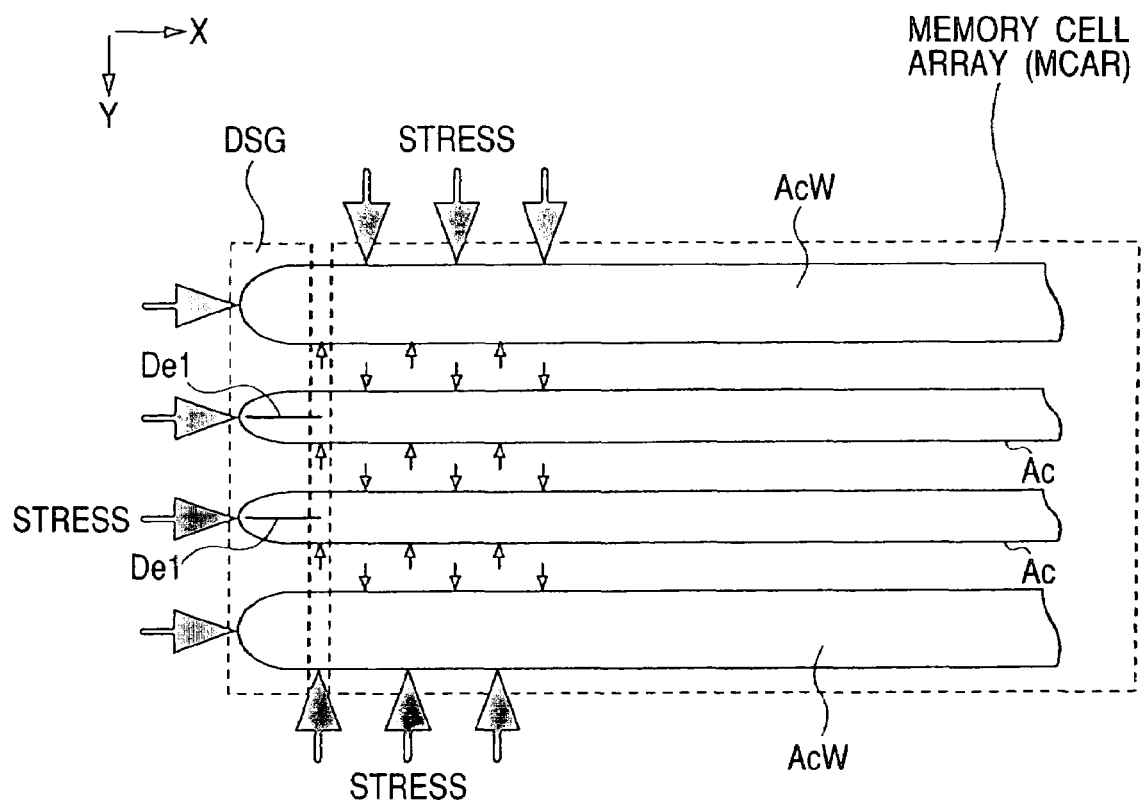
FIG. 17 is a plan view of a principal portion of the substrate in the semiconductor integrated circuit device of the third embodiment.

FIG. 16 is a plan view of a principal portion of a semiconductor integrated circuit device according to a third embodiment of the present invention. In FIG. 16, the right-hand portion represents a memory cell portion region MCFR, while the left-hand portion represents a peripheral circuit forming region PCFR. In the memory cell forming region are arranged NOR type non-volatile memory cells in an array form, while in the peripheral circuit forming region are formed MISFETs S for selection as an example of peripheral circuits. The construction of the semiconductor integrated circuit device of this third embodiment, as is apparent from a comparison thereof with FIG. 1, is the same as that of the first embodiment except that element forming regions AcW located at outermost positions are larger in width than the other element forming regions Ac. Therefore, a detailed description thereof will here be omitted and only a characteristic portion will be described.

More specifically, in the memory cell forming region, as shown in FIG. 16, element forming regions Ac and AcW each extending in X direction are arranged in Y direction at predetermined certain pitches. Of the element forming regions Ac and AcW, the element forming regions AcW located at endmost positions in Y direction are larger in width than the other element forming regions Ac.

Thus, in this embodiment, since the element forming regions AcW located at outermost positions are made larger in width than the other element forming regions Ac, it is possible to relieve the influence of stress and hence possible to diminish the generation rate of defect (De2) in the outermost element forming regions AcW. As a result, leakage current in memory cells can be diminished.

Moreover, if end portions of the element forming regions Ac and AcW are extended as described in the first embodiment, it is possible to prevent defect (De1) from extending up to the region where memory cells are formed and hence there can be obtained the effect described in the first embodiment.

(Fourth Embodiment)

Figure 18:
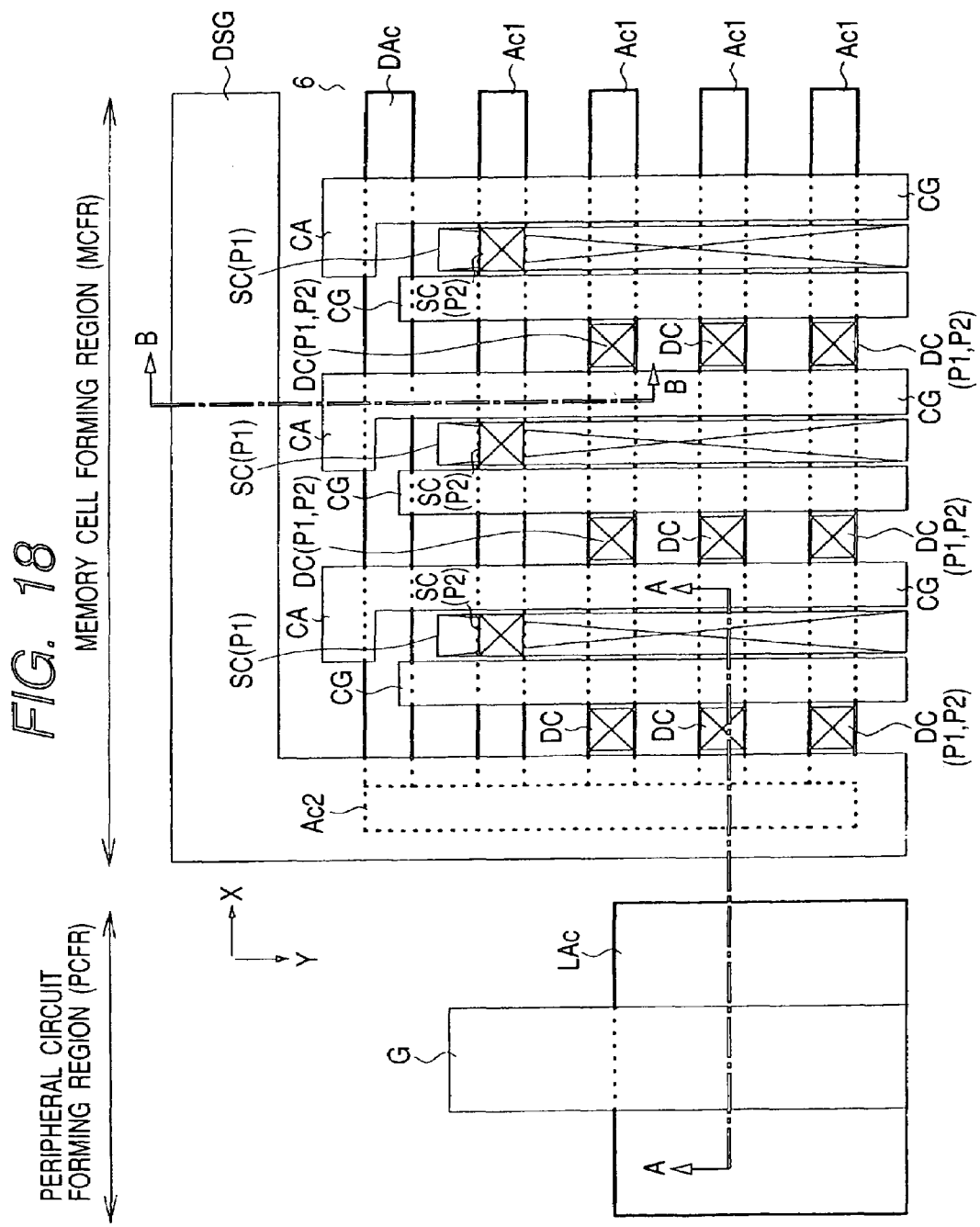
FIG. 18 is a plan view of a principal portion of a substrate, showing a semiconductor integrated circuit device according to a fourth embodiment of the present invention.
Figure 19:
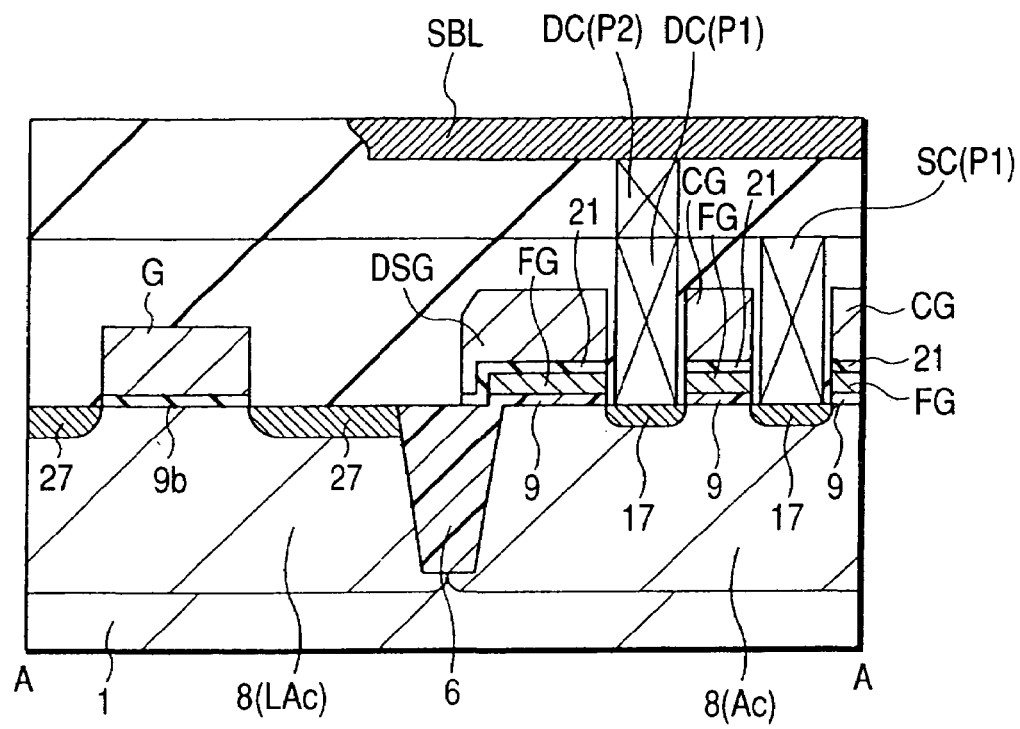
FIG. 19 is a sectional view of a principal portion of the substrate in the semiconductor integrated circuit device of the fourth embodiment.
Figure 20:
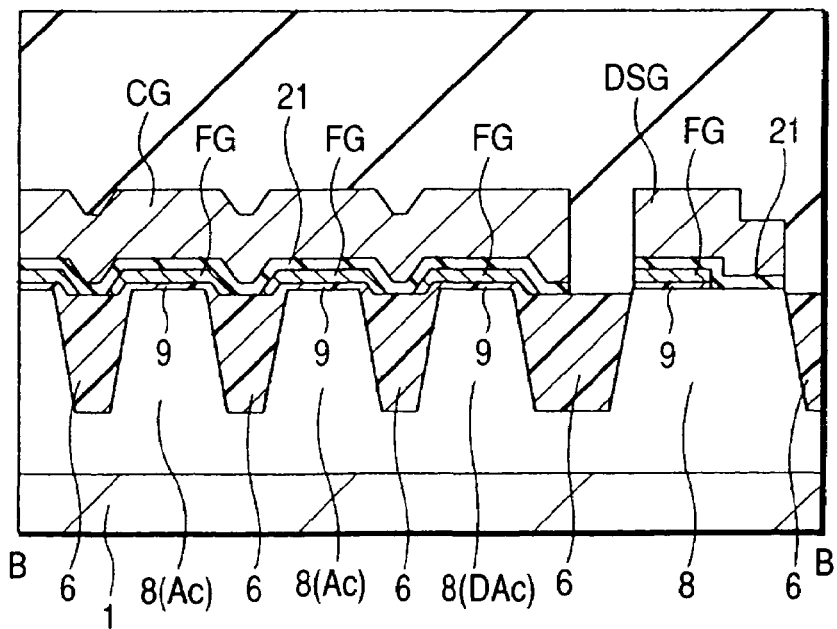
FIG. 20 is a sectional view of a principal portion of the substrate in the semiconductor integrated circuit device of the fourth embodiment.

FIG. 18 is a plan view of a principal portion of a semiconductor integrated circuit device according to a fourth embodiment of the present invention. In FIG. 18, the right-hand portion represents a memory cell forming region MCFR, while the left-hand portion represents a peripheral circuit forming region PCFR. In the memory cell forming region are arranged NOR type non-volatile memory cells in an array form, while in the peripheral circuit forming region are formed MISFETs S for selection as an example of peripheral circuits. FIG. 19 is a schematic sectional view taken on line A—A in FIG. 18 and FIG. 20 is a schematic sectional view taken on line B—B in FIG. 18.

The construction of the semiconductor integrated circuit device of this fourth embodiment, as is apparent from a comparison thereof with FIG. 13, is the same as that of the second embodiment except that an element forming region DAc is provided at an outermost position of plural element forming regions Ac1 arranged in the memory cell forming region. Therefore, a detailed description thereof will here be omitted and only a characteristic portion will be described.

More specifically, in the memory cell forming region, as shown in FIG. 18, element forming regions Ac1 each extending in X direction are arranged in Y direction at predetermined certain intervals and an element forming region DAc is disposed outside the element forming region Ac1 which is located at an outermost position out of the element forming regions Ac1.

On the element forming region DAc there is not formed any cell that functions as a memory cell. More particularly, although control gates CG extend in Y direction on the element forming region DAc, plugs DC or SC are not formed at both ends of the control gates CG.

At end portions in Y direction of the control gates are formed draw-out portions (connections between the control gates CG and the overlying wiring lines) CA for the control gates CG in an alternate manner. As to control gates CG not formed with such regions (CA) in FIG. 18, the aforesaid draw-out portions are provided at the other end portions not appearing in FIG. 18.

Figure 21:
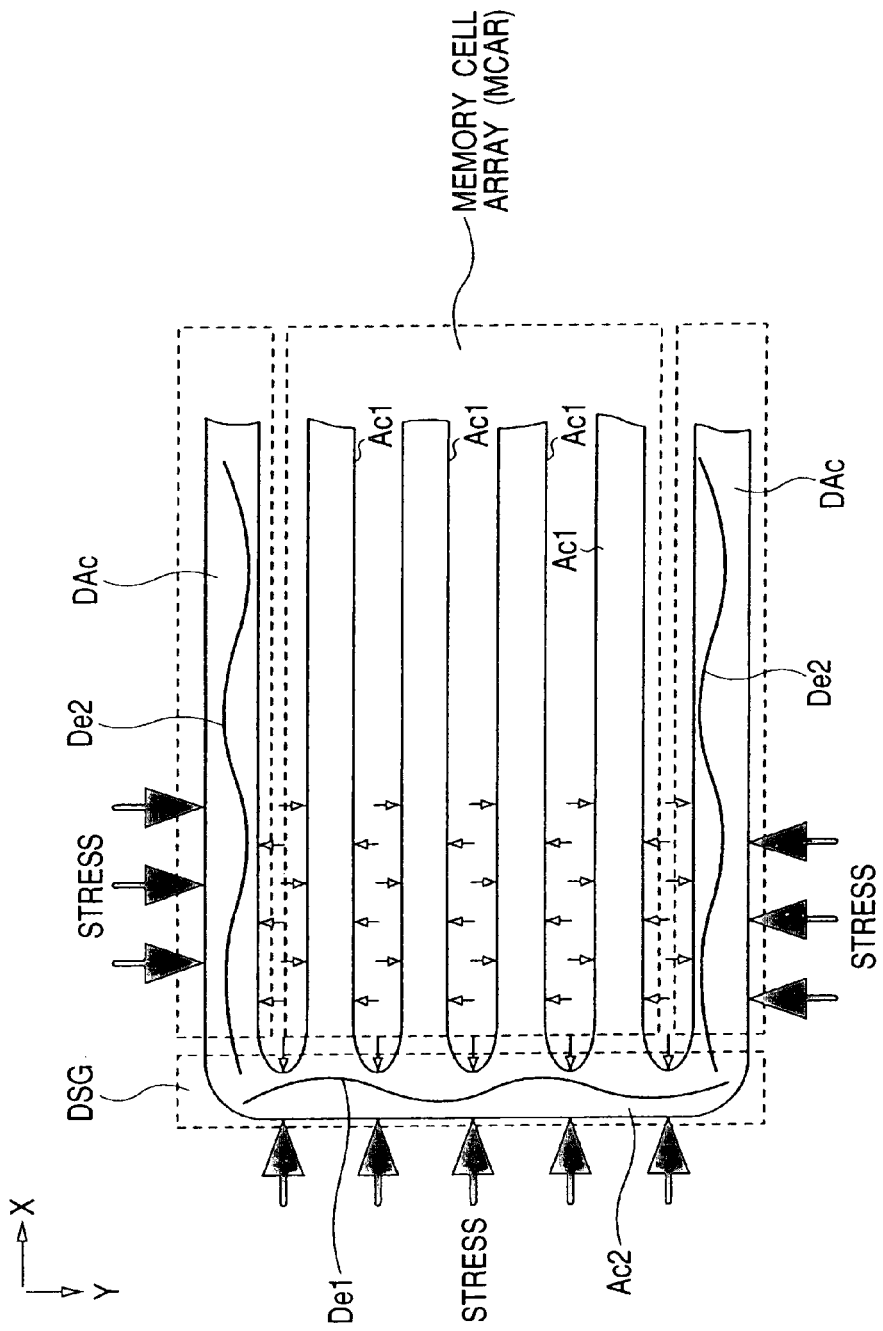
FIG. 21 is a plan view of a principal portion of the substrate in the semiconductor integrated circuit device of the fourth embodiment.

Thus, in this embodiment, since the element forming region DAc is provided at the outermost position of plural element forming regions Ac1, stress can be concentrated on this region and defect (De2) does not extend to the regions where memory cells are formed, i.e., the element forming portions Ac1 shown in FIG. 21, whereby it is possible to diminish leakage current in memory cells.

Moreover, since the element forming region DAc is formed by utilizing the space below the draw-out portions CA, it is possible to take a countermeasure to defects without enlarging the memory cell forming region.

Further, as described in the second embodiment, if end portions of the element forming regions (Ac1 and Dac) are connected together through a connecting portion Ac2, it is possible to obtain the effect (diminishing the influence of defect De1) described in the second embodiment.

Figure 22:
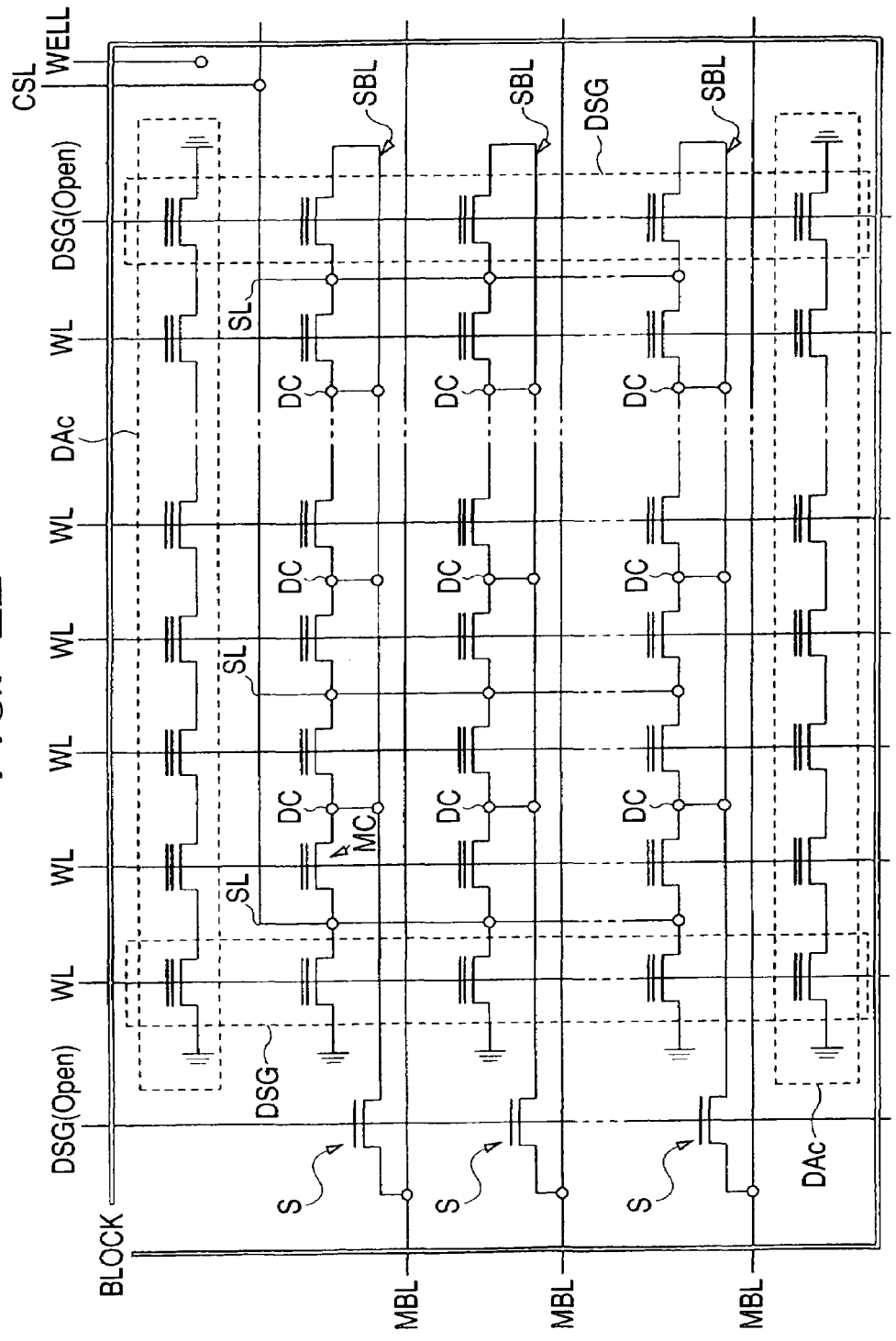
FIG. 22 is a circuit diagram corresponding to the semiconductor integrated circuit device of the fourth embodiment.

FIG. 22 is a circuit diagram corresponding the semiconductor integrated circuit device of this embodiment. As shown therein, memory cells are arranged in an array form, provided cells on DAc (element forming region) do not operate as memory cells. On DSG (dummy conductive film) are formed such pseudo memory cells as described in the first embodiment. MBL stands for a main bit line and S stands for MISFET for selection which has been described above. These memory cells are arranged with a certain block as one unit. For example, data can be erased together for each such block. Each block may be established well by well. Circuit diagrams corresponding to the semiconductor integrated circuit devices described in the first to third embodiments are the same as that of FIG. 22 except that memory cells are not present on DAc (element forming region).

Although the first to fourth embodiments have been described above, the present invention is not limited thereto. For example, end portions of the element forming regions Ac and AcW in the third embodiment may be connected together through the connecting portion Ac2 as in the second embodiment. Further, end portions of the element forming regions Ac1 and DAc in the fourth embodiment may be merely extended as in the first embodiment without connecting them through the connecting portion Ac2. Thus, constructions described in the above embodiments may be suitably combined.

(Fifth Embodiment)

The semiconductor integrated circuit devices of the above first to fourth embodiments are applicable to a computer system which will be described below.

Figure 23:
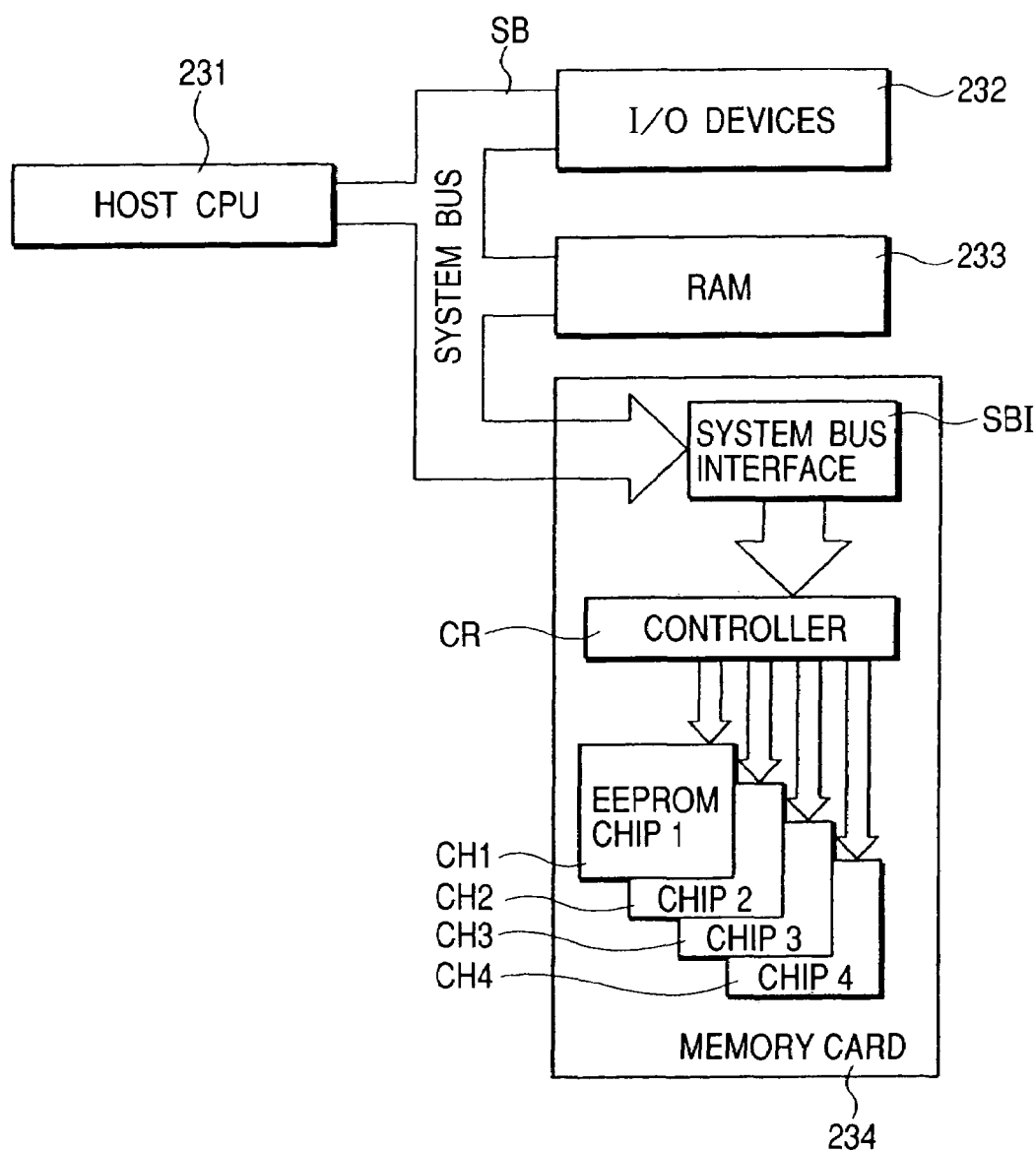
FIG. 23 is a diagram showing a computer system using a semiconductor integrated circuit device according to the present invention.

FIG. 23 illustrates a computer system which incorporates the semiconductor integrated circuit devices (non-volatile memories) described in the above first to fourth embodiments. This system is made up of a host CPU (Central Processing Unit) 231, I/O devices 232, a RAM (Random Access Memory) 233, and a memory card 234, which are interconnected through a system bus SB.

The memory card 234 includes non-volatile memories (EEPROM chips 1 to 4) of a large storage capacity of several ten gigabytes to be used for the replacement of a hard disk storage unit as an example. Since the memory card 234 is given the advantages of the non-volatile memories described in the first to fourth embodiments such as decrease of defects in the system, decrease of leakage current, or improvement in yield or reliability of the system, it possesses sufficient industrial advantages also as a storage unit which is the final product.

It goes without saying that in the present invention there is made no limitation to the relatively thin memory card 234, but that the invention is applicable to any non-volatile storage unit including an interface with a host bus system and an intelligent controller able to analyze commands from the host system and control non-volatile memories.

Data for a long-term storage are stored in the non-volatile storage unit, while data to be processed and frequently changed by the host CPU 231 are stored in the non-volatile RAM 233.

The card 234 has a system bus interface SAI connected to the system bus SB and enables a standard bus interface, e.g., ATA system bus. A controller CR, which is connected to the system bus interface SBI, accepts commands and data from such host systems as host CPU 231 and I/O devices 232 connected to the system bus SB.

In the case where an accepted command is a read instruction, the controller CR makes access to one or more required chips out of plural chips 1 to 4 (CH 1 to 4) having the non-volatile memories described in the first to fourth embodiments and transfers read data to the host system.

In the case where an accepted command is a write instruction, the controller CR makes access to one or more required chips out of plural chips 1 to 4 (CH 1 to 4) and stores write data from the host system in the interior thereof. This data storing operation involves programming and verifying operations for a required block or sector and memory cell in the accessed non-volatile memory or memories.

In the case where an accepted command is an erase instruction, the controller CR makes access to one or more required chips out of plural chips 1 to 4 (CH 1 to 4) and erases data stored in the interior thereof. The erasing operation involves erasing and verifying operations for a required block or sector or memory cell in the accessed non-volatile memory or memories.

It goes without saying that the non-volatile memories according to the embodiments of the present invention are applicable not only to a technique for making a memory cell have a binary threshold voltage for storing one bit of digital data in a single memory cell, but also to a technique for making a memory cell have a quaternary or larger multi-value threshold voltage in a memory cell for storing multiple bits of digital data in a single memory cell.

Although the present invention has been described concretely by way of embodiments thereof, it goes without saying that the invention is not limited to those embodiments, but that various changes may be made within the scope not departing from the gist of the invention.

Particularly, in the above embodiments reference has been made to an NOR type non-volatile memory as an example, but the present invention is applicable widely to semiconductor integrated circuit devices having elongated element forming regions, including AND and NAND type non-volatile memories.

The following is a brief description of effects obtained by typical inventions disclosed herein.

Element forming regions with memory cells formed thereon, which are defined by an insulating film, extend in a first direction and are arranged two or more in a second direction perpendicular to the first direction, then end portions of the element forming regions are extended to below a conductive film which is formed so as to surround the memory cells. Therefore, stress can be concentrated on those extended regions, that is, defects do not extend up to the regions where memory cells are formed and hence it is possible to diminish leakage current in memory cells.

Moreover, since element forming regions defined by an insulating film and extending in a first direction are arranged two or more in a second direction perpendicular to the first direction and end portions thereof are connected together through a connecting portion extending in the second direction, it is possible to change the direction in which stress is applied and hence possible to diminish leakage current in memory cells.

Further, plural element forming regions with memory cells formed thereon, which are defined by an insulating film, extend in a first direction and are arranged in a second direction perpendicular to the first direction, of which an outermost element forming region is made larger in width in the second direction than the other element forming regions. Therefore, it is possible to diminish the influence of stress and diminish leakage current in memory cells.

Further, plural element forming regions with memory cells formed thereon, which are defined by an insulating film, extend in a first direction and are arranged in a second direction perpendicular to the first direction, of which an outermost element forming region is not formed with any cell functioning as a memory cell, so that stress can be concentrated on the outermost element forming region and it is possible to diminish leakage current in memory cells.

As a result, it is possible to improve the yield and reliability of product.

What is claimed is:

1. A method of manufacturing a semiconductor integrated circuit device, comprising the steps of:
   (a) forming two or more element forming regions over a surface portion of a semiconductor substrate, said element forming regions being defined by an insulating film and each extending in a first direction and being arranged in a second direction perpendicular to said first direction;
   (b) forming a plurality of memory cells over main surfaces of said element forming regions; and
   (c) forming a conductive film over said semiconductor substrate, said conductive film having a first portion which extends in said first direction along a first side of said surface portion of said semiconductor substrate and a second portion which extends in said second direction along a second side of said surface portion,
   wherein said element forming regions have end portions positioned below said second portion of said conductive film.

2. A method of manufacturing a semiconductor integrated circuit device according to claim 1, wherein said step (b) includes:
   ($b_1$) forming a first electrode over a first insulating film on one of said element forming regions;
   ($b_2$) forming a second electrode over a second insulating film on said first electrode, said second electrode extending in said second direction; and
   ($b_3$) forming semiconductor regions in said one element forming region on both sides of said second electrode.

3. A method of manufacturing a semiconductor integrated circuit device according to claim 1,
   wherein said memory cells are non-volatile memory cells.

4. A method of manufacturing a semiconductor integrated circuit device according to claim 1, wherein said insulating film of step (a) is formed by a process comprising the steps of:
   ($a_1$) forming grooves in said semiconductor substrate; and
   ($a_2$) depositing insulating material in said grooves.

5. A method of manufacturing a semiconductor integrated circuit device according to claim 1, wherein memory cells formed on an outermost element forming region of said element forming regions do not function as memory cells.

6. A method of manufacturing a semiconductor integrated circuit device, comprising the steps of:
   (a) forming two or more element forming regions over a surface portion of a semiconductor substrate, said element forming regions being defined by an insulating film and each extending in a first direction and being arranged in a second direction perpendicular to said first direction;
   (b) forming a plurality of memory cells over main surfaces of said element forming regions; and
   (c) forming a conductive film over said semiconductor substrate, said conductive film having at least a portion extending in said second direction,
   wherein said element forming regions have end portions positioned below said portion of said conductive film.

7. A method of manufacturing a semiconductor integrated circuit device according to claim 6, wherein said step (b) includes:
   ($b_1$) forming a first electrode over a first insulating film on one of said element forming regions;
   ($b_2$) forming a second electrode over a second insulating film on said first electrode, said second electrode extending in said second direction; and
   ($b_3$) forming semiconductor regions in the said one element forming region on both sides of said second electrode.

8. A method of manufacturing a semiconductor integrated circuit device according to claim 7, wherein said memory cells are non-volatile memory cells.

9. A method of manufacturing a semiconductor integrated circuit device according to claim 6, wherein said insulating film of step (a) is formed by a process comprising the steps of:
- ($a_1$) forming grooves in said semiconductor substrate; and
- ($a_2$) depositing insulating material in said grooves.

10. A method of manufacturing a semiconductor integrated circuit device according to claim 6, wherein memory cells formed on an outermost element forming region of said element forming regions do not function as memory cells.

11. A method of manufacturing a semiconductor integrated circuit device comprising steps of:
- (a) forming element isolation regions in a semiconductor substrate so as to provide two or more element forming regions over a surface of said semiconductor substrate;
- (b) forming a plurality of memory cells over main surfaces of said element forming regions; and
- (c) forming a conductive film over said semiconductor substrate,
- wherein said element forming regions extend in a first direction, and
- wherein said conductive film has at least a portion extending in a second direction, perpendicular to said first direction, and disposed over end portions of said element forming regions.

12. A method of manufacturing a semiconductor integrated circuit device according to claim 11, wherein said step (a) includes:
- ($a_1$) forming grooves in said semiconductor substrate; and
- ($a_2$) depositing an insulating film in said grooves.

13. A method of manufacturing a semiconductor integrated circuit device according to claim 11, wherein said step (b) includes:
- ($b_1$) forming a first electrode over a first insulating film on one of said element forming regions;
- ($b_2$) forming a second electrode over a second insulating film on said first electrode; and
- ($b_3$) forming semiconductor regions in the said one element forming region on both sides of said second electrode.

14. A method of manufacturing a semiconductor integrated circuit device according to claim 11, wherein said memory cells are non-volatile memory cells.

15. A method of manufacturing a semiconductor integrated circuit device according to claim 11, wherein memory cells formed on an outermost element forming region of said element forming regions do not function as memory cells.

16. A method of manufacturing a semiconductor integrated circuit device, comprising the steps of:
- (a) forming grooves in a semiconductor substrate;
- (b) depositing insulating material in said grooves to define two or more element forming regions over a surface portion of said substrate, said element forming regions extending in a first direction and being arranged in a second direction perpendicular to said first direction;
- (c) forming a plurality of memory cells over main surfaces of said element forming regions; and
- (d) forming a conductive film over said semiconductor substrate, said conductive film having a first portion which extends in said first direction along a first side of said surface portion of said substrate, arid a second portion which extends in said second direction along a second side of said surface portion and which is disposed over end portions of said element forming regions.

17. A method of manufacturing a semiconductor integrated circuit device according to claim 16, wherein said step (c) includes:
- ($c_1$) forming a first electrode on a first insulating film over one of said element forming regions;
- ($c_2$) forming a second electrode on a second insulating film over said first electrode; and
- ($c_3$) forming semiconductor regions in said one element forming region on both sides of said second electrode.

18. A method of manufacturing a semiconductor integrated circuit device according to claim 16, wherein said memory cells are non-volatile memory cells.

19. A method of manufacturing a semiconductor integrated circuit device according to claim 16, wherein memory cells formed on an outermost element forming region of said element forming regions do not function as memory cells.

* * * * *